US012568671B2

(12) United States Patent
Shitomi et al.

(10) Patent No.: US 12,568,671 B2
(45) Date of Patent: Mar. 3, 2026

(54) SEMICONDUCTOR DEVICE AND METHOD FOR MANUFACTURING THE SAME

(71) Applicant: Mitsubishi Electric Corporation, Tokyo (JP)

(72) Inventors: Takuichiro Shitomi, Tokyo (JP); Manabu Yoshino, Tokyo (JP); Toshihiro Imasaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 518 days.

(21) Appl. No.: 18/066,902

(22) Filed: Dec. 15, 2022

(65) Prior Publication Data

US 2023/0275133 A1 Aug. 31, 2023

(30) Foreign Application Priority Data

Feb. 25, 2022 (JP) ................................. 2022-027838

(51) Int. Cl.
H10D 64/00 (2025.01)
H10D 64/01 (2025.01)
(52) U.S. Cl.
CPC ........... H10D 64/115 (2025.01); H10D 64/01 (2025.01)
(58) Field of Classification Search
CPC ................. H10D 64/115; H10D 64/01; H10D 84/0151; H10D 84/038; H10D 84/83; H10D 64/112; H10D 84/0126; H01L 21/761; H01L 21/765
See application file for complete search history.

(56) References Cited

U.S. PATENT DOCUMENTS

| | | | |
|---|---|---|---|
| 2016/0056248 A1* | 2/2016 | Tanaka ................. | H10D 12/411 |
| | | | 257/329 |
| 2016/0276425 A1 | 9/2016 | Saito | |
| 2016/0300912 A1* | 10/2016 | Tanaka .................. | H10D 30/65 |
| 2019/0097002 A1* | 3/2019 | Nakanishi ........... | H10D 84/144 |

FOREIGN PATENT DOCUMENTS

| | | |
|---|---|---|
| JP | 2013-179327 A | 9/2013 |
| JP | 2016-042542 A | 3/2016 |
| JP | 2016-178200 A | 10/2016 |
| JP | 2016-201415 A | 12/2016 |

OTHER PUBLICATIONS

An Office Action issued by the German Patent and Trademark Office on Apr. 8, 2024, which corresponds to German Patent Application No. 102023104085.5 and is related to U.S. Appl. No. 18/066,902; with English language translation.
"Notice of Reasons for Refusal" Office Action issued in JP 2022-027838; mailed by the Japanese Patent Office on Oct. 22, 2024.

* cited by examiner

*Primary Examiner* — Syed I Gheyas
(74) *Attorney, Agent, or Firm* — Studebaker Brackett PLLC

(57) ABSTRACT
A resistive field plate is arranged in a spiral shape in plan view so as to gradually approach an inner main electrode from an outer main electrode. The plurality of floating layers are arranged radially toward the low potential region around the high potential region in plan view. The resistive field plate is provided on the plurality of floating layers via an interlayer insulating film, and thus has a floating step reflecting a film thickness of each of the plurality of floating layers. That is, the resistive field plate is provided in such a manner that the floating step is repeatedly generated along the lapping direction.

6 Claims, 16 Drawing Sheets

F I G.  1
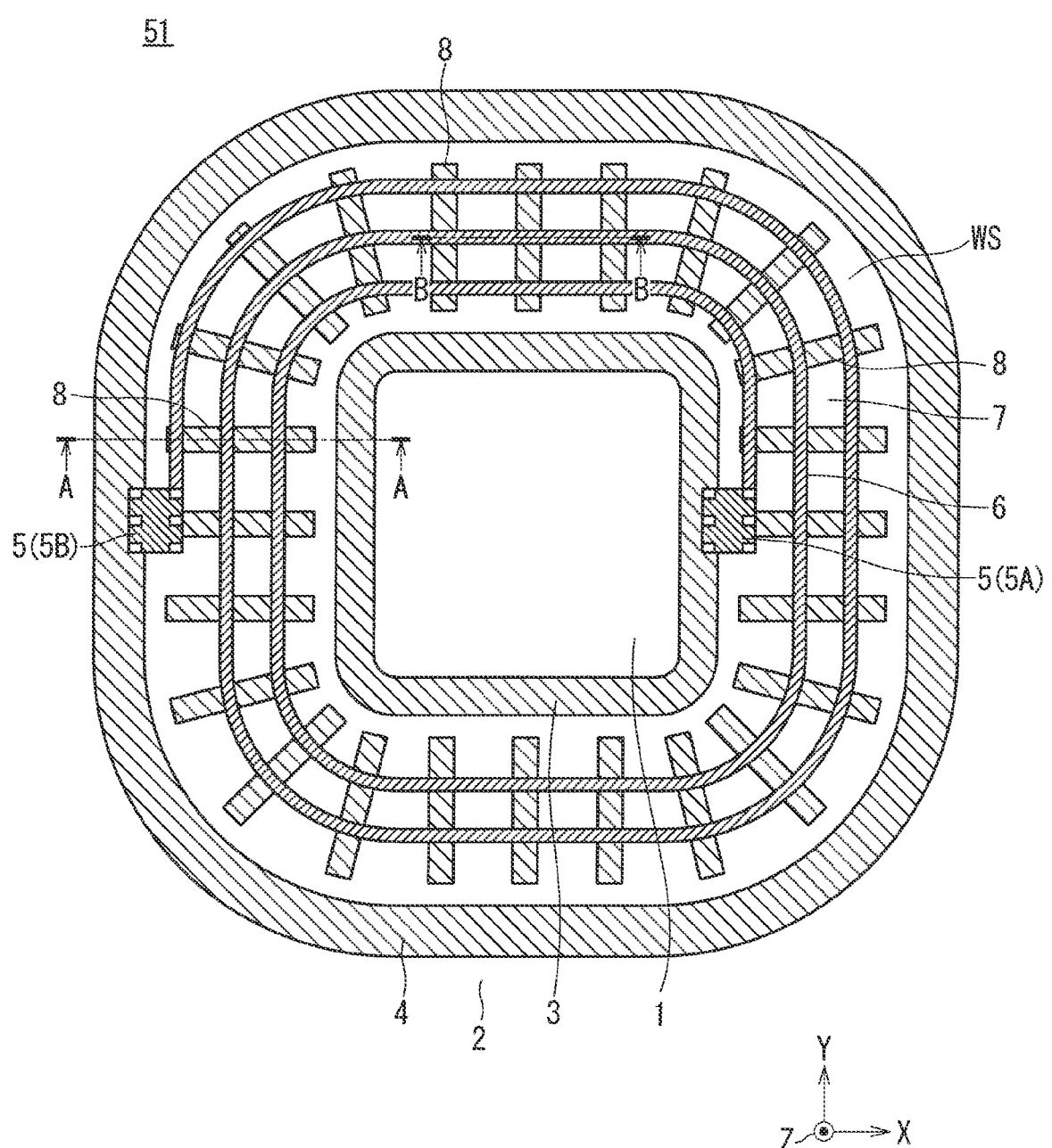

F I G. 2
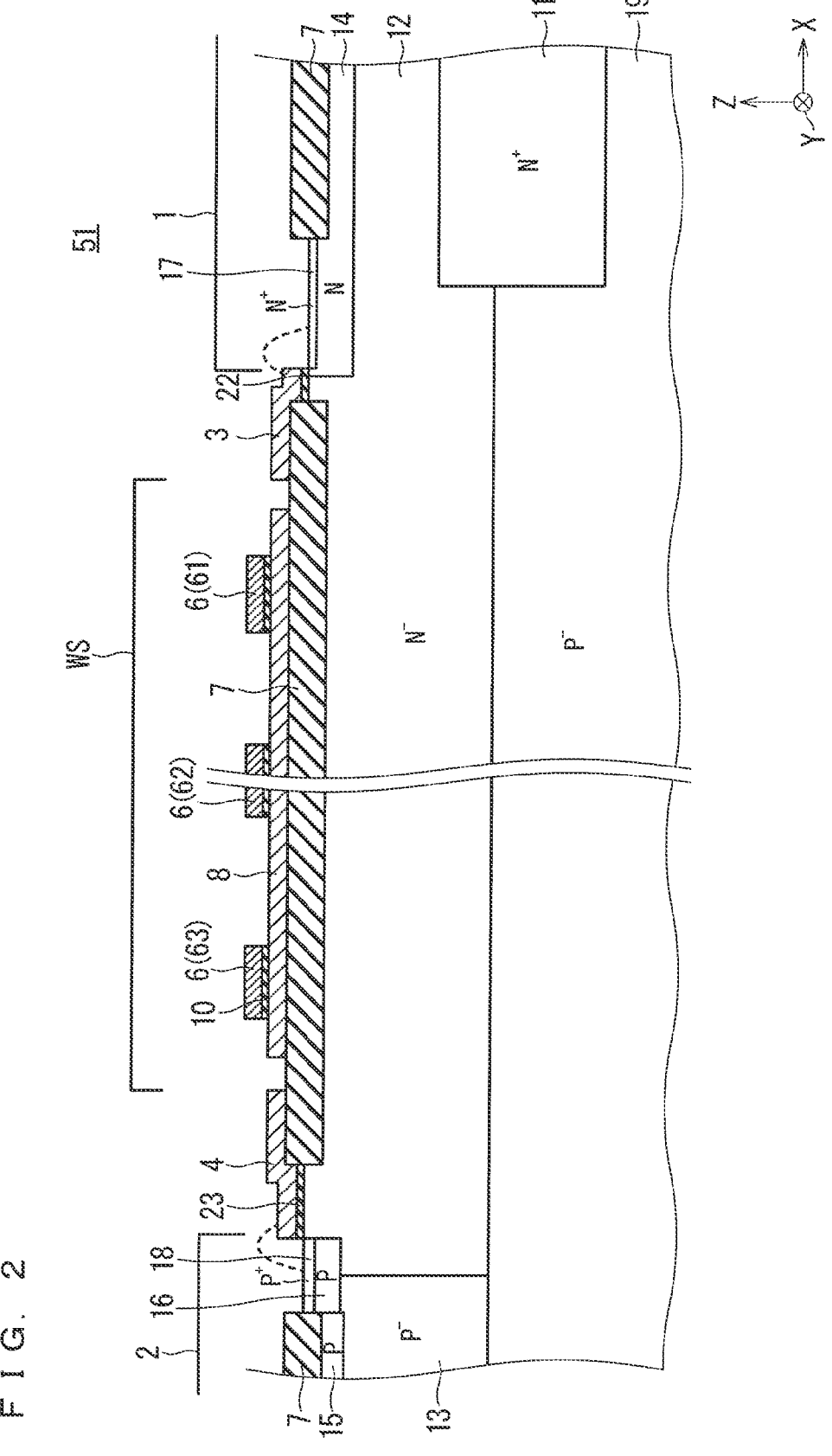

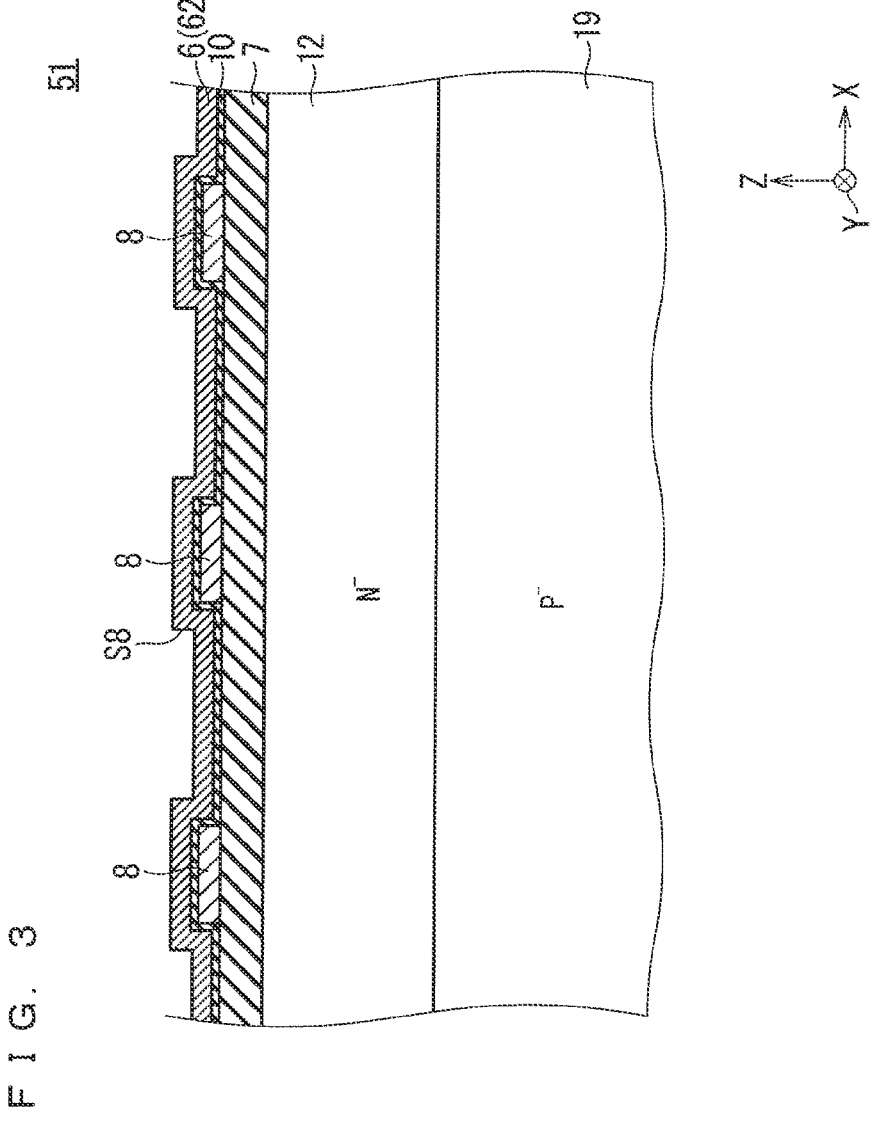
F I G. 3

F I G. 5
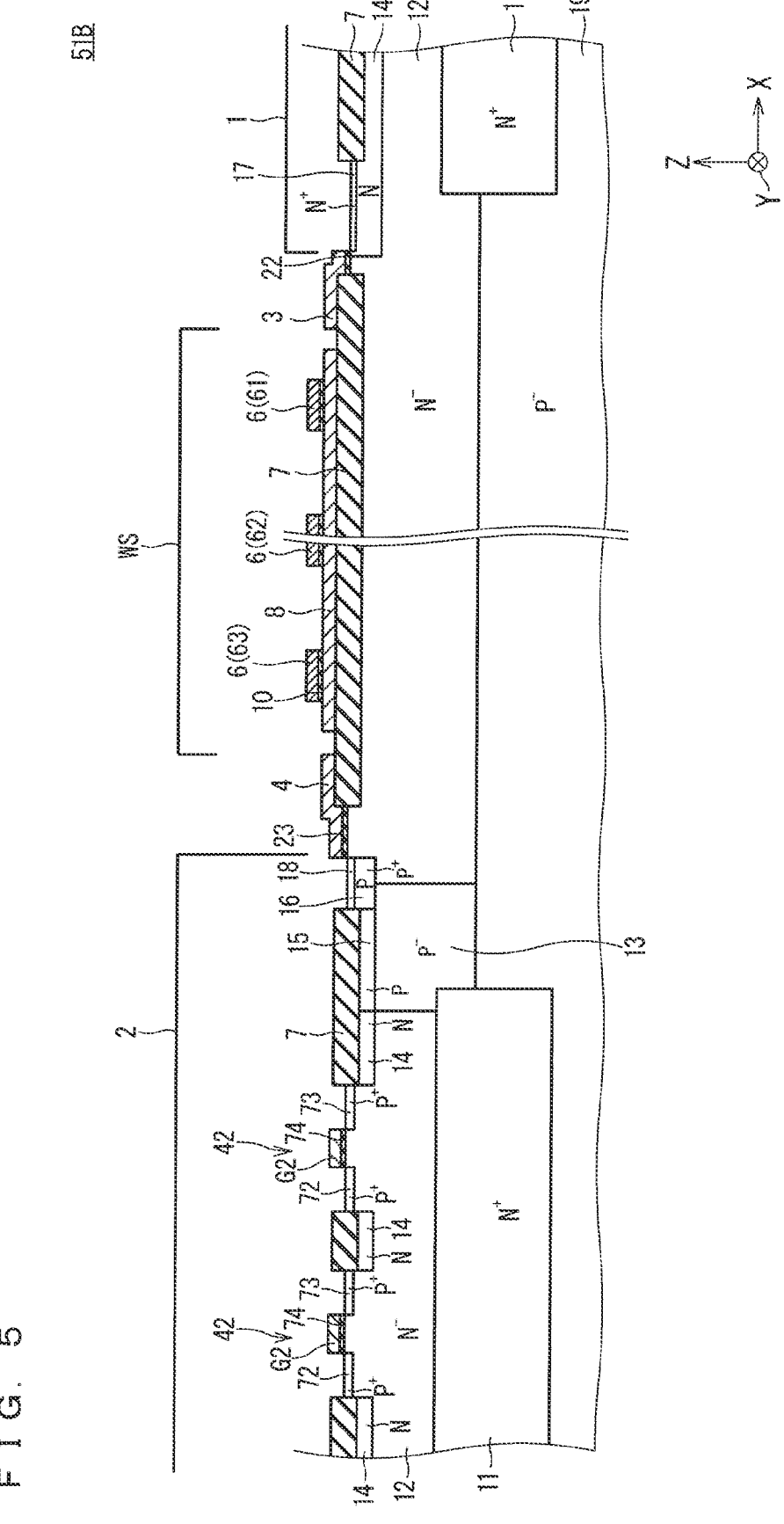

F I G. 6
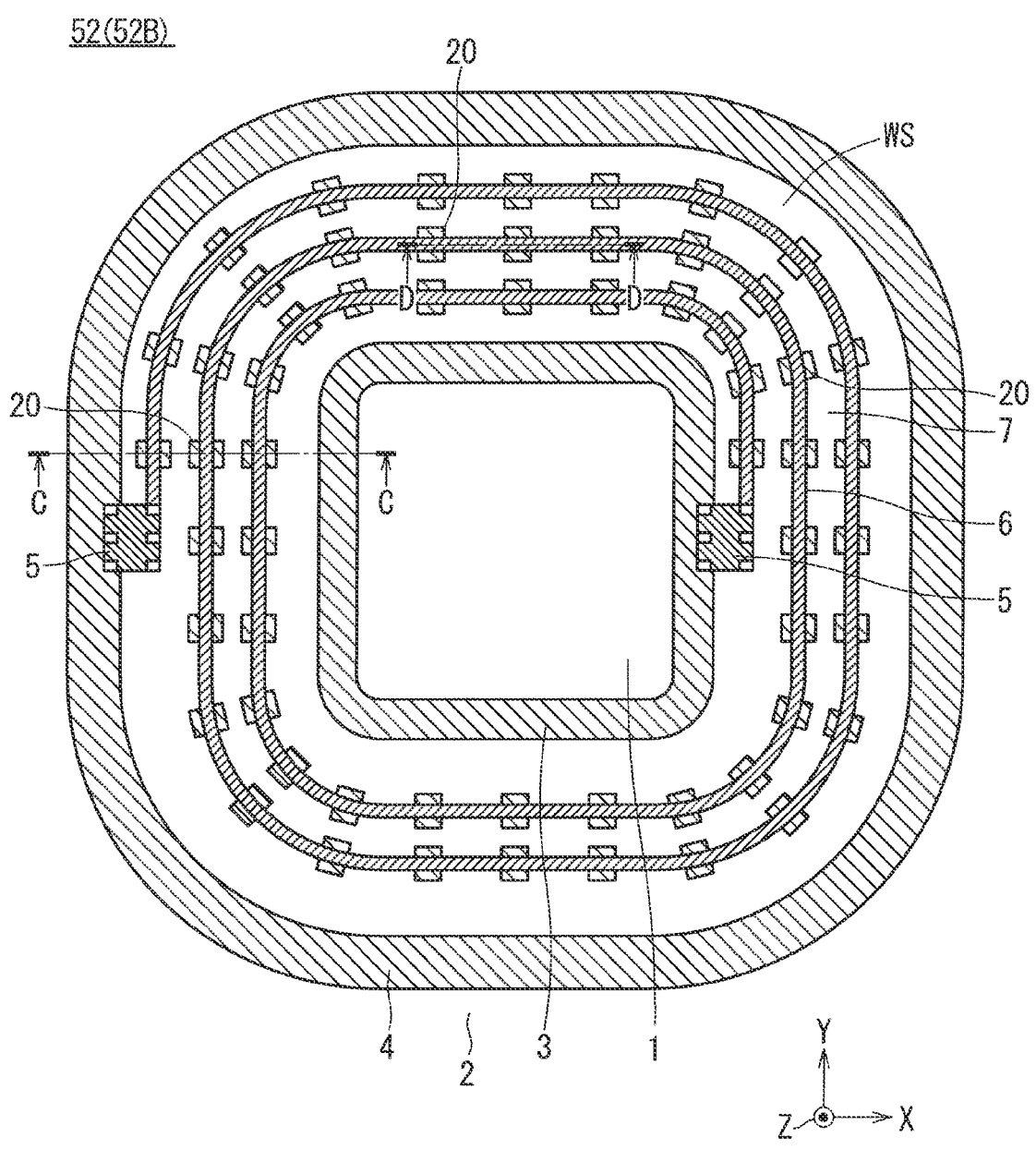

F I G. 7
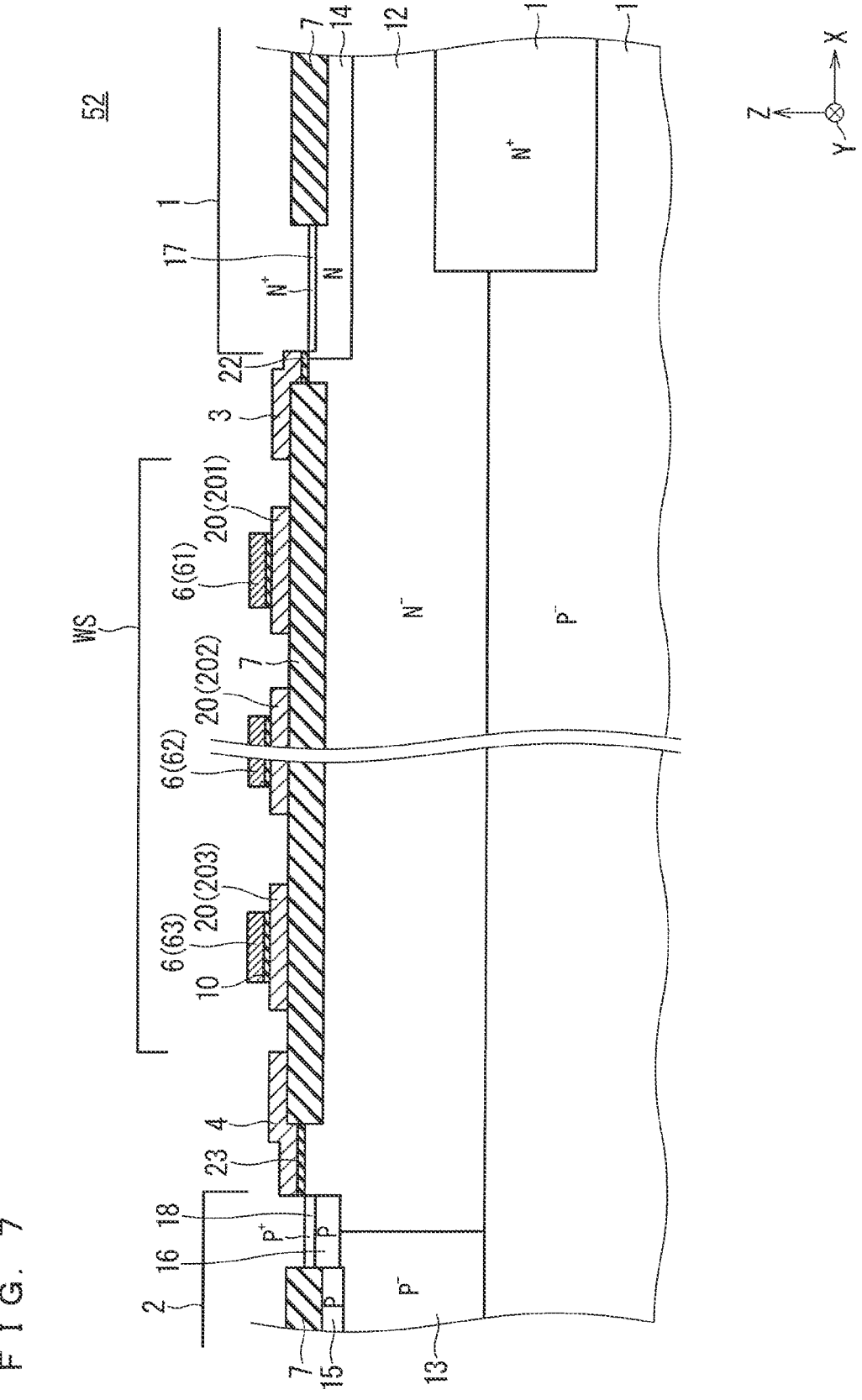

F I G . 8
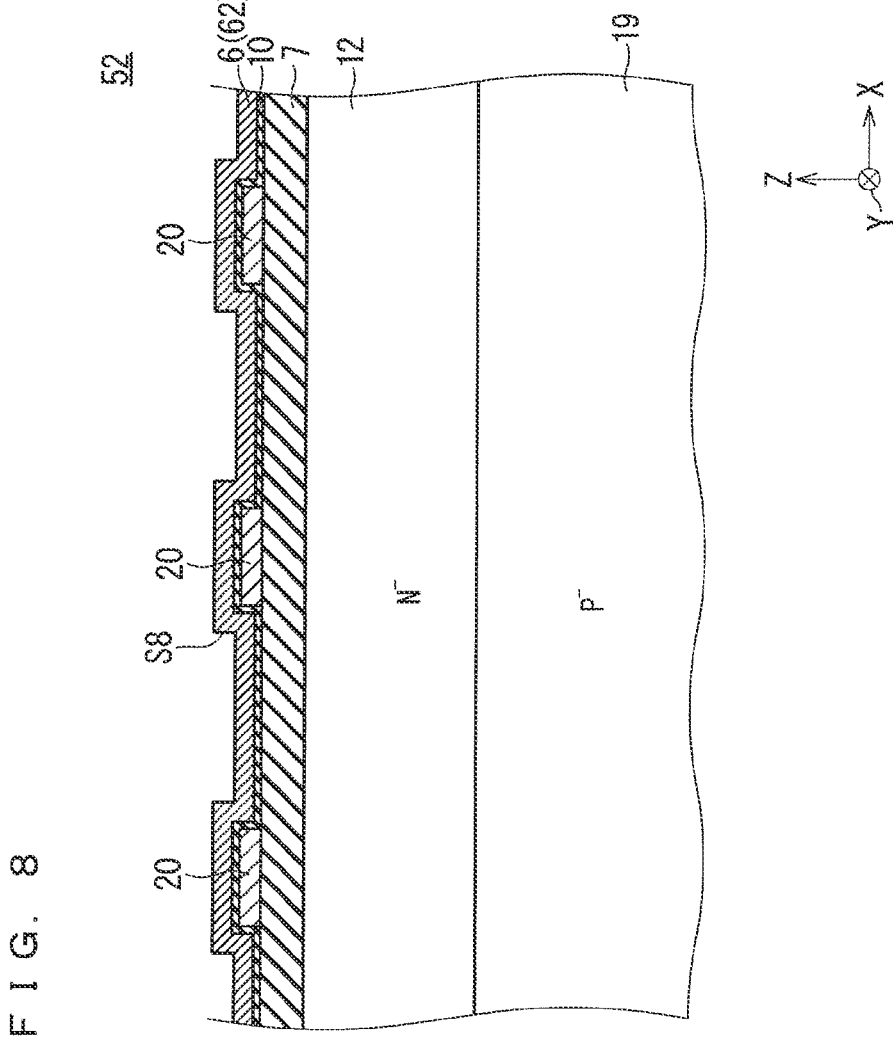

F I G. 9
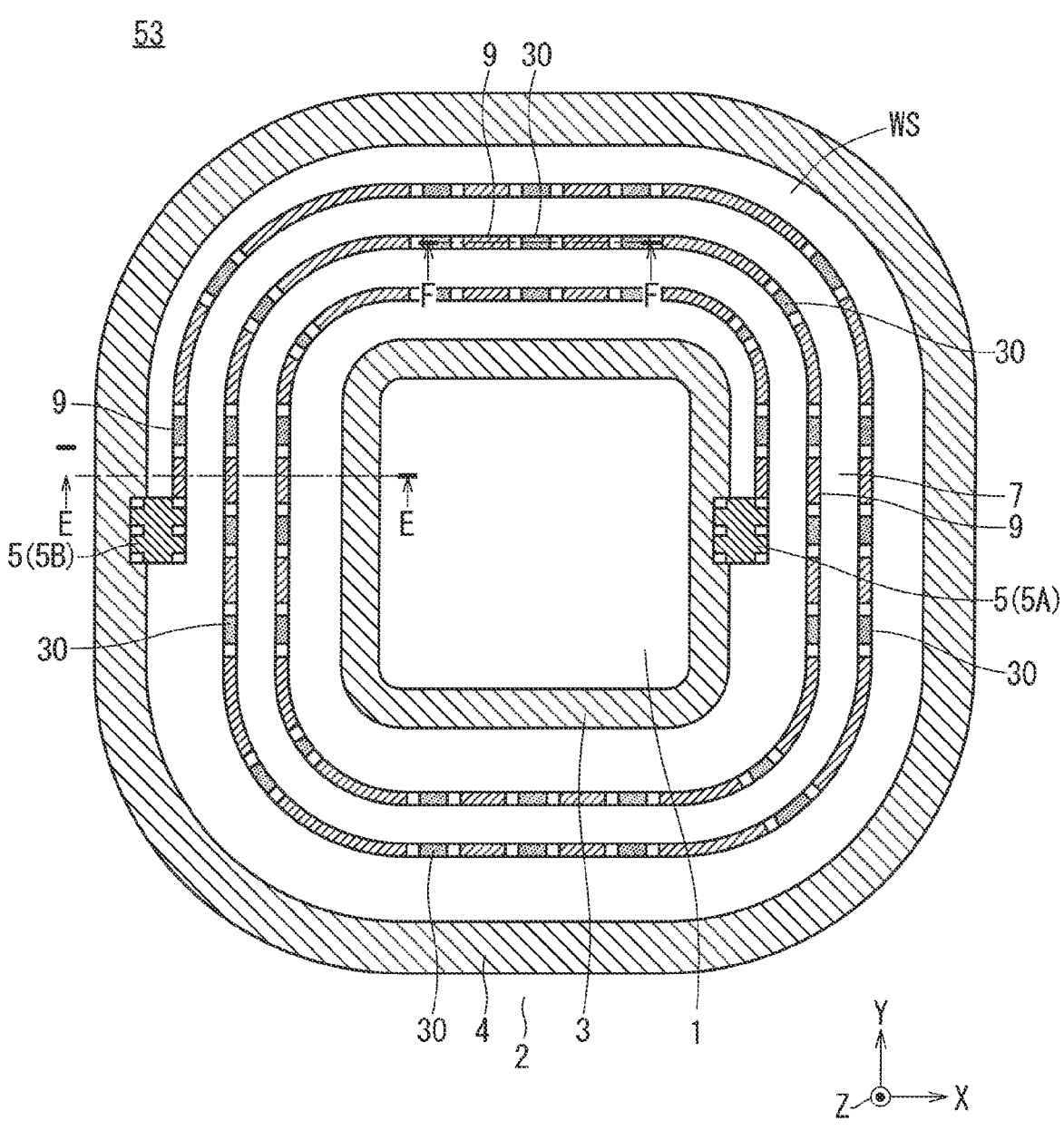

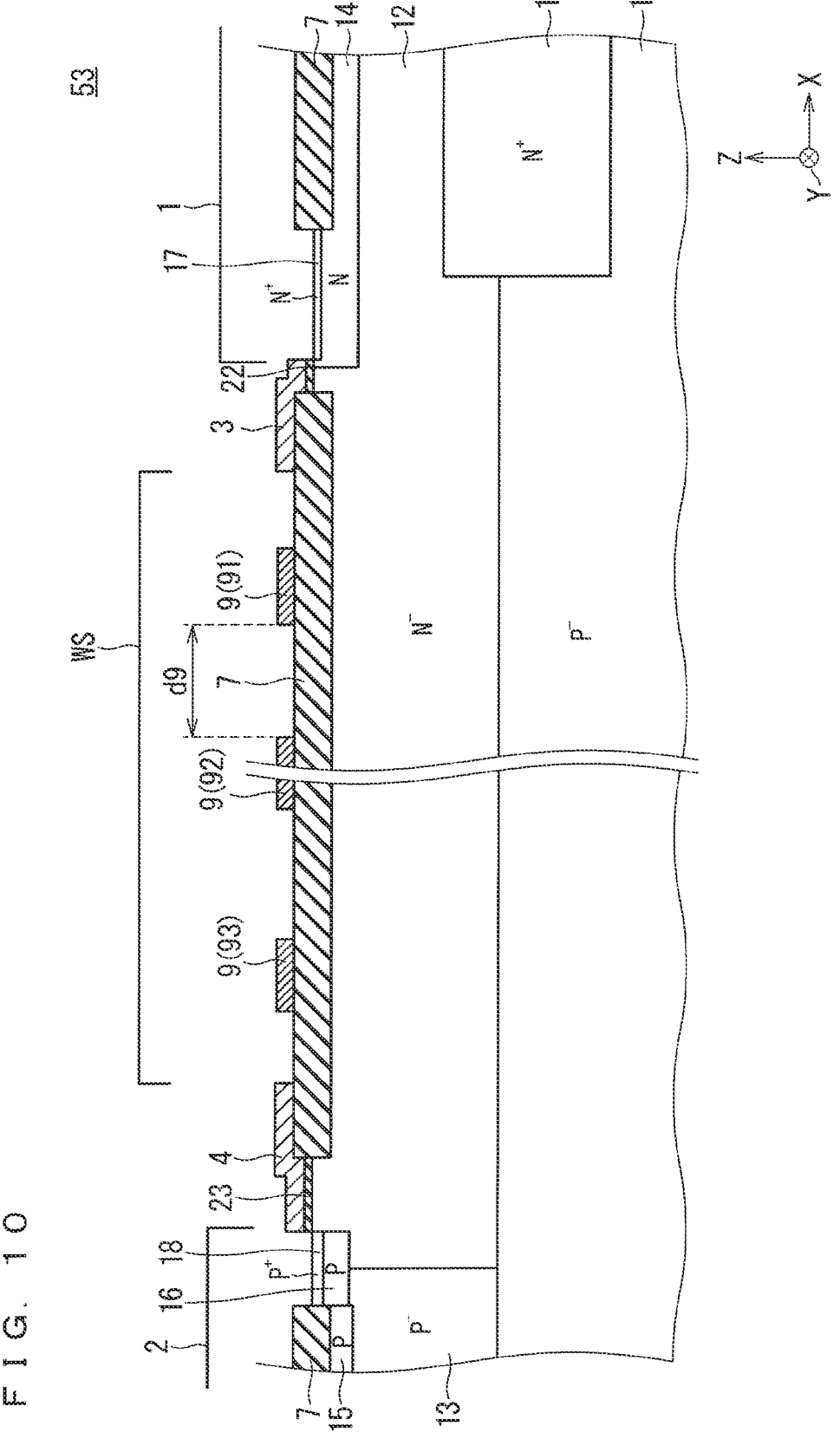
F I G . 1 0

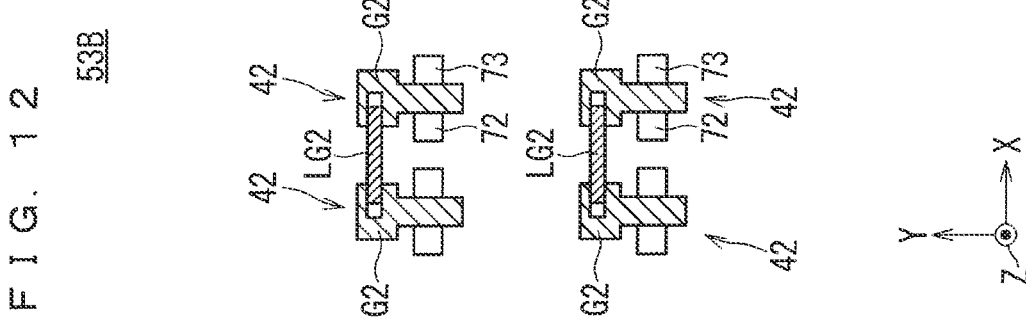
F I G .   1 2

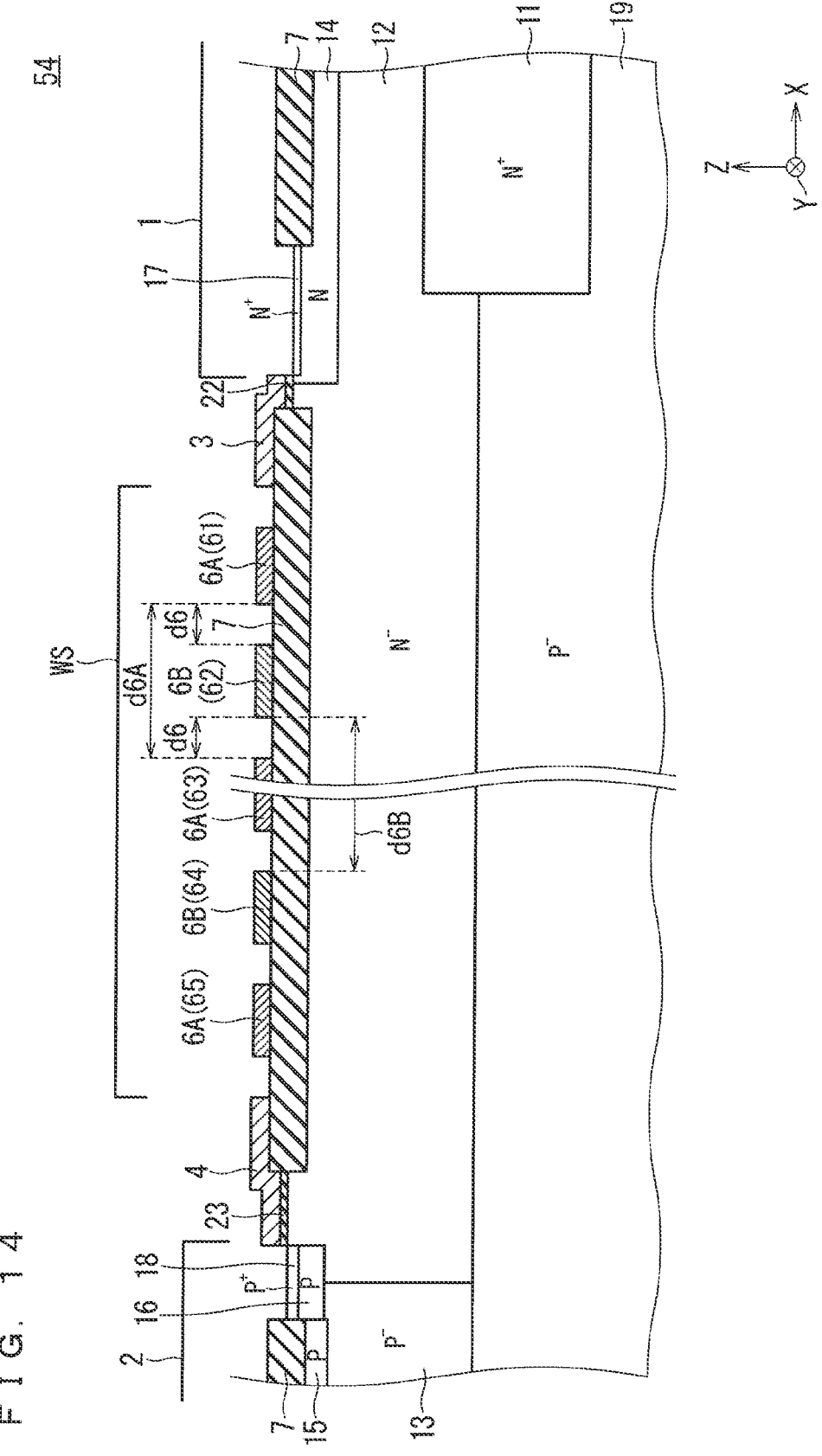
F I G. 1 4

F I G. 1 5
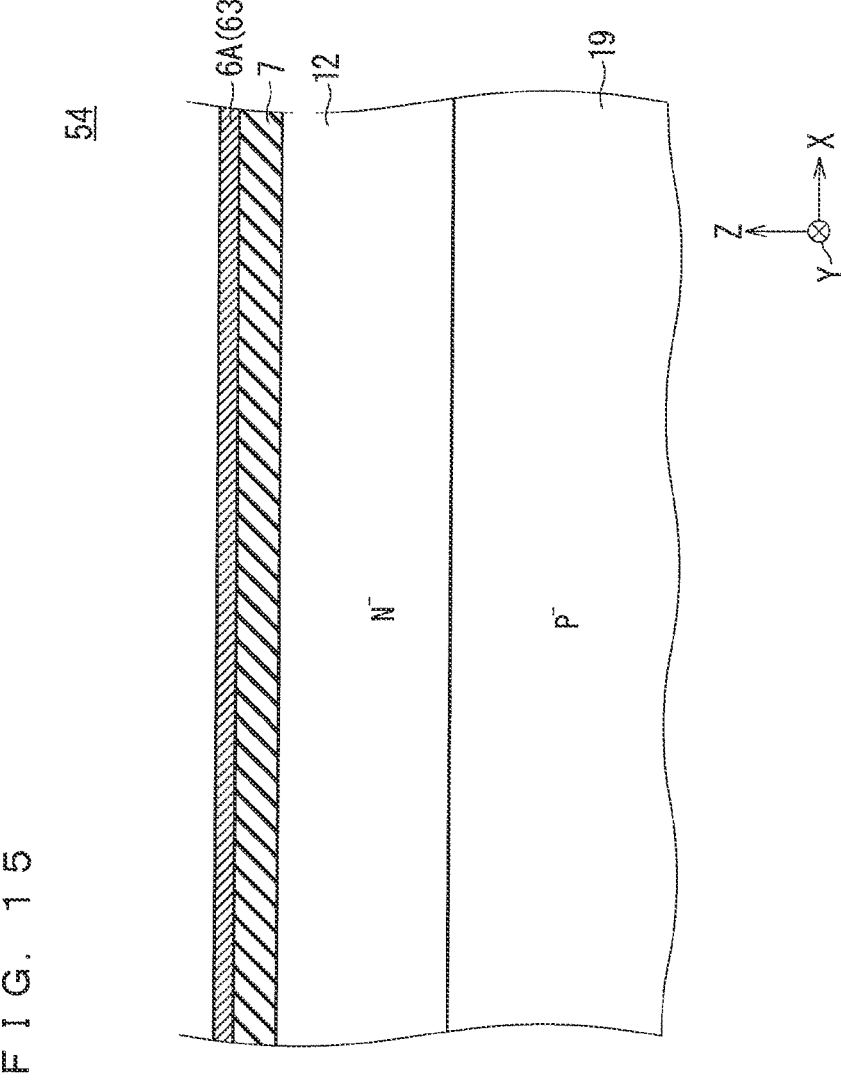

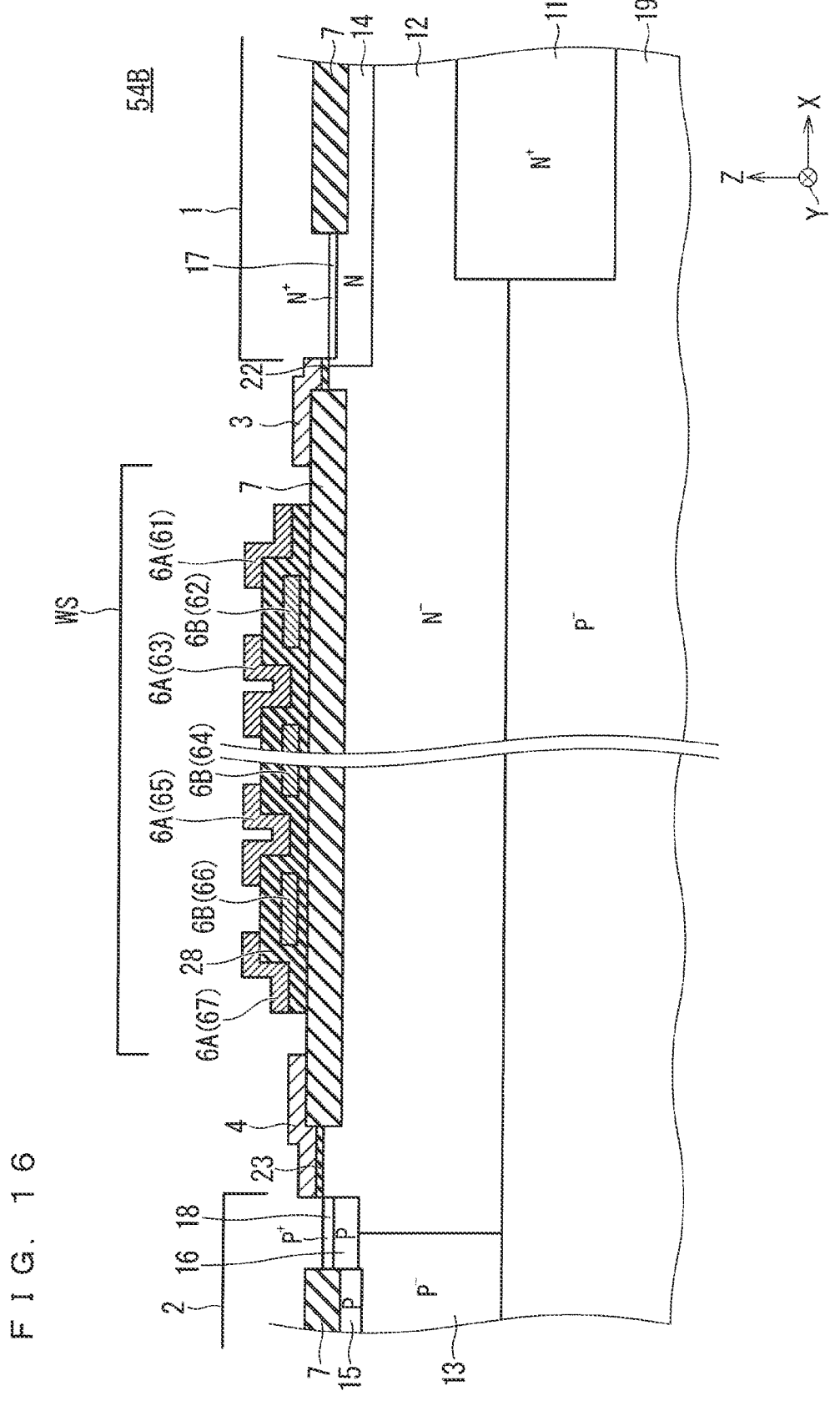
F I G. 16

SEMICONDUCTOR DEVICE AND METHOD FOR MANUFACTURING THE SAME

BACKGROUND OF THE INVENTION

Field of the Invention

The present disclosure relates to a semiconductor device having a high withstand voltage structure including a resistive field plate formed on a semiconductor substrate, and a method for manufacturing the same.

Description of the Background Art

A semiconductor device having a high withstand voltage structure such as a high withstand voltage IC often has a high withstand voltage structure using a capacitive field plate or a resistive field plate. As a semiconductor device having a high withstand voltage structure using a resistive field plate, for example, there is a semiconductor device disclosed in Japanese Patent Application Laid-Open No. 2016-042542.

In the semiconductor device disclosed in Japanese Patent Application Laid-Open No. 2016-042542, a resistance value of the resistive field plate is increased by forming an uneven shape in an insulating film provided under the resistive field plate, so that the leakage current flowing at the time of holding the withstand voltage and the power consumption are reduced.

In the conventional semiconductor device having a high withstand voltage structure disclosed in Japanese Patent Application Laid-Open No. 2016-042542, the resistance value of the resistive field plate formed in an insulating film shape is increased by forming an uneven shape in the insulating film. Since an additional mask or processing step is required to execute a partial oxidation treatment or an etching treatment for manufacturing an insulating film having an uneven shape, there is a problem that the process cost of the semiconductor device increases.

SUMMARY

An object is to obtain a semiconductor device having a high withstand voltage structure including a resistive field plate while suppressing an increase in process cost.

A first aspect of a semiconductor device according to the present disclosure is a semiconductor device including a high potential region and a low potential region provided on a semiconductor substrate, and the low potential region is provided away from the high potential region so as to surround the high potential region.

The semiconductor device of the first aspect includes a first main electrode, a second main electrode, and an inter-electrode connection portion.

The first main electrode is provided to be electrically connected to the high potential region, and the second main electrode is provided to be electrically connected to the low potential region.

The inter-electrode connection portion is provided in a high withstand voltage separation region between the first and second main electrodes and electrically connects the first main electrode and the second main electrode.

The inter-electrode connection portion includes a resistive field plate (6) provided in a spiral shape in plan view so as to surround the high potential region.

The semiconductor device of the first aspect further includes a floating layer having conductivity provided below the resistive field plate via an insulating film in the high withstand voltage separation region.

The floating layer, the first main electrode, and the second main electrode are provided on the same formation layer, and the resistive field plate has a floating step reflecting a film thickness of the floating layer.

A second aspect according to the present disclosure is a semiconductor device including a high potential region and a low potential region provided on a semiconductor substrate, and the low potential region is provided away from the high potential region so as to surround the high potential region.

The semiconductor device of the second aspect includes a first main electrode, a second main electrode, and an inter-electrode connection portion.

The first main electrode is provided to be electrically connected to the high potential region, and the second main electrode is provided to be electrically connected to the low potential region.

The inter-electrode connection portion is provided in a high withstand voltage separation region between the first and second main electrodes and electrically connects the first main electrode and the second main electrode.

The inter-electrode connection portion includes a plurality of thin film resistors and at least one high-resistance connection member.

The plurality of thin film resistors are provided separately from each other, and the at least one high-resistance connection member is provided in a stacked structure.

Each of the at least one high-resistance connection member electrically connects a pair of thin film resistors adjacent to each other among the plurality of thin film resistors.

A main wiring region including the plurality of thin film resistors and the at least one high-resistance connection member is provided in a spiral shape so as to surround the high potential region in plan view.

In the first aspect of the semiconductor device of the present disclosure, since the resistive field plate has the floating step reflecting the film thickness of the floating layer, the formation length increases and the resistance value increases.

Furthermore, since the floating layer having conductivity is provided on the same formation layer as the first and second main electrodes, the floating layer can be manufactured together when the first and second main electrodes are manufactured, so that an increase in process cost required for the manufacturing process can be suppressed.

As a result, according to the first aspect of the semiconductor device of the present disclosure can reduce the leakage current flowing between the first main electrode and the second main electrode in the withstand voltage structure using the resistive field plate by suppressing an increase in process cost and increasing the resistance value of the resistive field plate.

In the second aspect of the semiconductor device of the present disclosure, the pair of thin film resistors adjacent to each other among the plurality of thin film resistors are electrically connected by the high-resistance connection member.

Therefore, the resistance value of the main wiring region can be increased by increasing the resistance value of each of the at least one high-resistance connection member.

As a result, the second aspect of the semiconductor device of the present disclosure can reduce the leakage current flowing between the first main electrode and the second main electrode in the withstand voltage structure using the plurality of thin film resistors by increasing the resistance value of the main wiring region.

Furthermore, in the second aspect of the semiconductor device of the present disclosure, when the resistance value of the main wiring region increases, an increase in cost required for the manufacturing process can be suppressed because components other than the main wiring region are not used.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is an explanatory view illustrating a top surface structure of a high withstand voltage semiconductor device which is a first preferred embodiment;

FIG. 2 is a cross-sectional view illustrating a cross-sectional structure taken along line A-A of FIG. 1;

FIG. 3 is a cross-sectional view illustrating a cross-sectional structure taken along line B-B in FIG. 1;

FIG. 5 is a cross-sectional view illustrating a cross-sectional structure taken along line A2-A2 in FIG. 4;

FIG. 6 is an explanatory view illustrating a top surface structure of a high withstand voltage semiconductor device which is a second preferred embodiment;

FIG. 7 is a cross-sectional view illustrating a cross-sectional structure taken along line C-C in FIG. 6;

FIG. 8 is a cross-sectional view illustrating a cross-sectional structure taken along line D-D in FIG. 6;

FIG. 9 is an explanatory view illustrating a top surface structure of a high withstand voltage semiconductor device which is a third preferred embodiment;

FIG. 10 is a cross-sectional view illustrating a cross-sectional structure taken along line E-E in FIG. 9;

FIG. 12 is an explanatory view illustrating a top surface structure of a modification of the third preferred embodiment;

FIG. 14 is a cross-sectional view illustrating a cross-sectional structure taken along line G-G in FIG. 13;

FIG. 15 is a cross-sectional view illustrating a cross-sectional structure taken along line H-H in FIG. 13; and FIG. 16 is a cross-sectional view illustrating a cross-sectional structure of a modification of the fourth preferred embodiment.

DESCRIPTION OF THE PREFERRED EMBODIMENTS

First Preferred Embodiment

Figure 4:
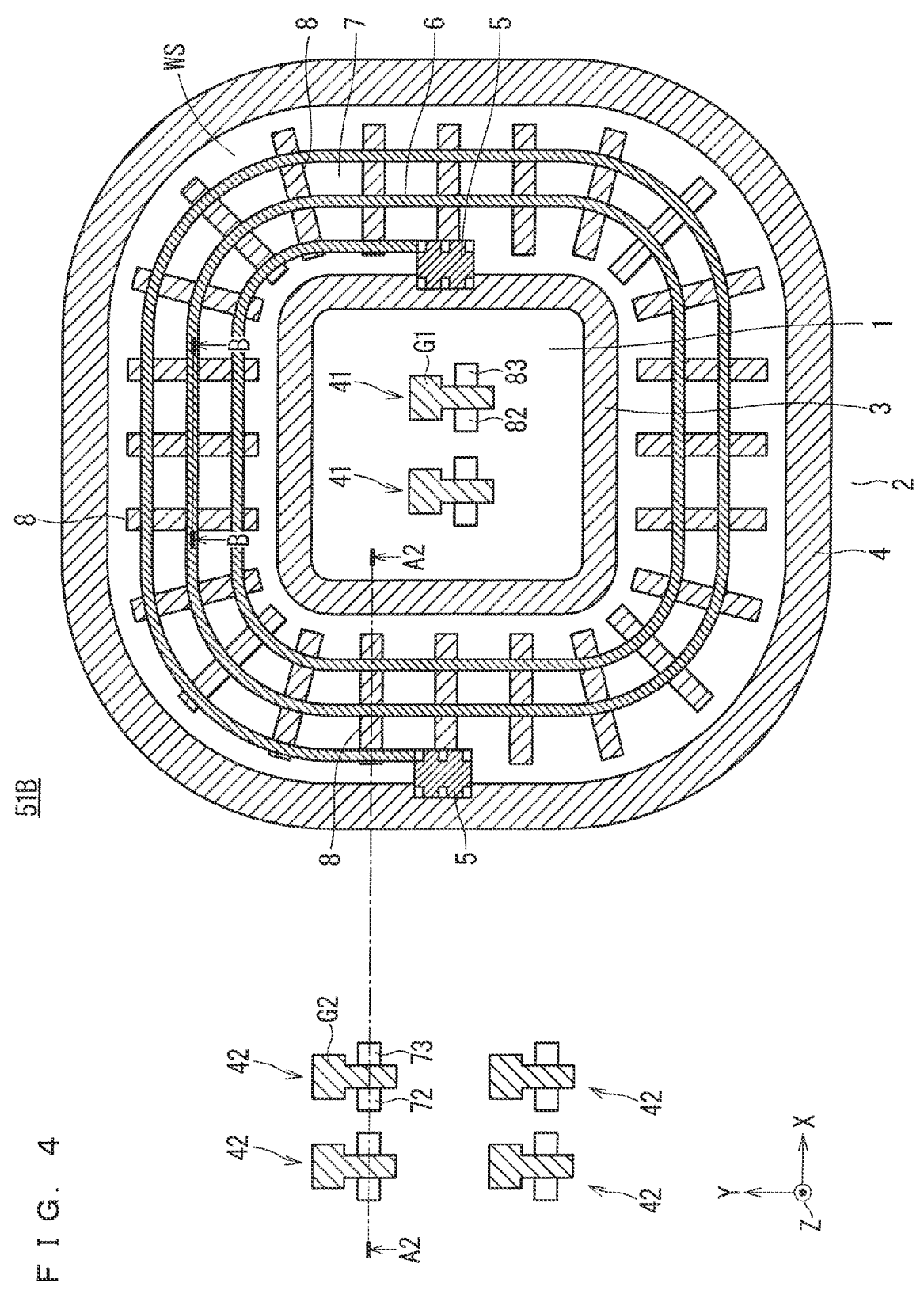
FIG. 4 is an explanatory view illustrating a top surface structure of a modification of the first preferred embodiment.

FIG. 1 is an explanatory view illustrating a top surface structure of a high withstand voltage semiconductor device 51 which is a semiconductor device of a first preferred embodiment of the present disclosure. The high withstand voltage semiconductor device 51 of the first preferred embodiment functions as a high voltage integrated circuit (HVIC) chip that drives and controls a power device such as an insulated gate bipolar transistor (IGBT) or a power MOSFET. FIG. 1 schematically illustrates a high potential region 1 and a low potential region 2, and a high withstand voltage separation region WS dividing these regions 1 and 2.

FIG. 2 is a cross-sectional view illustrating a cross-sectional structure taken along line A-A in FIG. 1, and FIG. 3 is a cross-sectional view illustrating a cross-sectional structure taken along line B-B in FIG. 1. An XYZ orthogonal coordinate system is illustrated in each of FIGS. 1 to 3.

As illustrated in FIGS. 1 to 3, a high withstand voltage semiconductor device 51 which is the semiconductor device of the first preferred embodiment includes a high potential region 1 and a low potential region 2 provided on a P⁻ type silicon substrate 19 which is a semiconductor substrate. As illustrated in FIGS. 1 to 3, the high potential region 1 is provided inside the P⁻ type silicon substrate 19, and the low potential region 2 is provided outside the high potential region 1 away from the high potential region 1 so as to surround the high potential region 1 in plan view.

As illustrated in FIG. 2, a main electrode 3 serving as a first main electrode is provided from an insulating film 7 to an insulating film 22. The main electrode 3 is electrically connected to an N⁺ type diffusion layer 17 provided in the high potential region 1 via electrical connection means such as an external wiring (not illustrated). Therefore, the main electrode 3 serving as the first main electrode is electrically connected to the high potential region 1.

In addition, as illustrated in FIG. 2, a main electrode 4 serving as a second main electrode is provided from the insulating film 7 to an insulating film 23. The main electrode 4 is electrically connected to a P⁺ type diffusion layer 18 provided in the low potential region 2 via electrical connection means such as an external wiring (not illustrated). Therefore, the main electrode 4 serving as the second main electrode is electrically connected to the low potential region 2.

On the P type silicon substrate 19, a region between the main electrode 3 and the main electrode 4 serves as a high withstand voltage separation region WS. In the high withstand voltage separation region WS, an inter-electrode connection portion electrically connecting the main electrode 3 serving as the first main electrode and the main electrode 4 serving as the second main electrode is provided.

As illustrated in FIG. 1, the inter-electrode connection portion includes two jumper wirings 5 and one resistive field plate 6. Among the two jumper wirings 5, the jumper wiring 5 on the high potential region 1 side is classified into a jumper wiring 5A, and the jumper wiring 5 on the low potential region 2 side is classified into a jumper wiring 5B.

The jumper wiring 5A is electrically connected to the high potential region 1, and the jumper wiring 5B is electrically connected to the low potential region 2. In the resistive field plate 6, an end portion on the high potential region 1 side is electrically connected to the jumper wiring 5A, and an end portion on the low potential region 2 side is electrically connected to the jumper wiring 5B.

The main electrode 3 and the main electrode 4 are electrically connected by the inter-electrode connection portion including the two jumper wirings 5 and one resistive field plate 6 described above. The main electrode 3 and the main electrode 4 are each made of doped polysilicon.

The resistive field plate 6 serving as a main component of the inter-electrode connection portion is arranged in a spiral shape in plan view so as to gradually approach the inner main electrode 3 from the outer main electrode 4. As described above, since the resistive field plate 6 is provided to lap around the high potential region 1 a plurality of times in plan view, the resistive field plate 6 is classified into a plurality of lap plate regions corresponding to the number of laps.

For example, as illustrated in FIG. 2, the resistive field plate 6 can be classified into lap plate regions 61 to 63 from the high potential region 1 to the low potential region 2. In the resistive field plate 6, the lap plate region 61 serves as the innermost lap plate region, and the lap plate region 63 serves as the outermost lap plate region.

In FIG. 2, the break line provided at the center of the high withstand voltage separation region WS is provided in consideration of the variations of structures in which the number of lap plate regions of the resistive field plate 6 exceeds "3". Hereinafter, description will be given on the assumption that the number of lap plate regions is the maximum "3" following the structure of FIG. 1.

Each of the two jumper wirings 5 includes, for example, a contact hole and a first-layer metal wiring. The first-layer metal wiring serves as a formation layer above formation layers of the main electrode 3 and the main electrode 4. The jumper wiring 5 may have a stacked structure like a jumper wiring 30 of a third preferred embodiment or a jumper wiring 25 of a fourth preferred embodiment described later.

The high withstand voltage semiconductor device 51 of the first preferred embodiment further includes a plurality of floating layers 8 formed in the high withstand voltage separation region WS and each having conductivity. The plurality of floating layers 8 are provided below the resistive field plate 6 via an interlayer insulating film 10.

The plurality of floating layers 8 are arranged radially toward the low potential region 2 around the high potential region 1 in plan view. That is, each of the plurality of floating layers 8 is provided to extend in the lapping transverse direction which is a direction transverse to the lapping direction around which the resistive field plate 6 laps in plan view.

As illustrated in FIGS. 2 and 3, each of the plurality of floating layers 8 is provided below each of the plurality of lap plate regions with respect to the resistive field plate 6. For example, as illustrated in FIG. 2, one unit of the floating layer 8 is provided below each of the lap plate regions 61 to 63.

As described above, in the high withstand voltage semiconductor device 51, the resistive field plate 6 is provided on the plurality of floating layers 8 via the interlayer insulating film 10, and thus has a floating step S8 reflecting the film thickness of each of the plurality of floating layers 8. That is, the resistive field plate 6 is provided in such a manner that the floating step S8 is repeatedly generated along the lapping direction of the spiral.

As illustrated in FIG. 2, the plurality of floating layers 8 are provided on the same formation layer as the main electrode 3 and the main electrode 4. That is, the plurality of floating layers 8, the main electrode 3 which is the first main electrode, and the main electrode 4 which is the second main electrode are provided on the insulating film 7 which is the same formation layer.

Next, a structure on the P⁻ type silicon substrate 19 will be described. An N⁻ type diffusion layer 12 is provided on the P⁻ type silicon substrate 19. In addition, an N⁺ type diffusion layer 11 is selectively provided from the upper layer portion of the P⁺ type silicon substrate 19 to the lower layer portion of the N+type diffusion layer 11. Further, in the high withstand voltage separation region WS, the insulating film 7 is provided on the upper layer portion of the N⁻ type diffusion layer 12. The insulating film 7 is provided to extend below each of the main electrode 3 and the main electrode 4.

In the high potential region 1, an N type diffusion layer 14 is provided on the upper layer portion of the N⁻ type diffusion layer 12, and the N⁺ type diffusion layer 17 and the insulating film 7 are provided on the upper layer portion of the N type diffusion layer 14.

Further, the insulating film 22 is provided on the upper layer portion of the N-type diffusion layer 12 below the main electrode 3. The main electrode 3 is provided from a part of the insulating film 7 to the insulating film 22. As described above, the main electrode 3 is electrically connected to the N⁺ type diffusion layer 17.

Furthermore, in the low potential region 2, the P⁻ type diffusion layer 13 is provided adjacent to the N⁻ type diffusion layer 12, and the P type diffusion layer 15 is selectively provided on the upper layer portion of the P⁻ type diffusion layer 13. Furthermore, a P type diffusion layer 16 is provided from the upper layer portion of the P⁻ type diffusion layer 13 to the upper layer portion of the N⁻ type diffusion layer 12. The P⁺ type diffusion layer 18 is provided on the P type diffusion layer 16.

Further, the insulating film 23 is provided on the upper layer portion of the N⁻ type diffusion layer 12 below the main electrode 4. The insulating film 7 provided in the high withstand voltage separation region WS is provided adjacent to each of the insulating film 22 under the main electrode 3 and the insulating film 23 under the main electrode 4.

The main electrode 4 is provided from a part of the insulating film 7 to the insulating film 23. As described above, the main electrode 4 is electrically connected to the P⁺ type diffusion layer 18.

Hereinafter, the function of each of the semiconductor layers 11 to 18 will be described.

The N⁺ type diffusion layer 11 serving as an N⁺ buried layer has a function of improving and separating a punch-through withstand voltage between a P type diffusion region (not illustrated) in the high potential region 1 and the P⁻ type silicon substrate 19.

The N⁻ type diffusion layer 12 functions as an N well region, and the P⁻ type diffusion layer 13 functions as a P well region. A depletion layer can be extended from both the P⁻ type diffusion layer 13 and the P⁻ type silicon substrate 19 to the N⁻ type diffusion layer 12 to maintain a high withstand voltage.

In the high potential region 1, the N type diffusion layer 14 functions as an inversion prevention layer and is formed in a region overlapping the N⁺ type diffusion layer 17 in plan view, so that an N type ohmic contact is easily formed. In addition, the N type diffusion layer 14 below the insulating film 7 in the high potential region 1 prevents inversion to the P type due to a negative potential of a wiring (not illustrated) formed on the insulating film 7.

In the low potential region 2, the P type diffusion layer 15 functions as an inversion prevention layer, and prevents inversion of the P⁻ type diffusion layer 13 below the insulating film 7 to the N type due to a positive potential of a wiring (not illustrated) formed on the insulating film 7.

The P type diffusion layer 16 functions as a P type body region. The P type diffusion layer 16 is formed in the same region as the P⁺ type diffusion layer 18 in plan view, so that a P type ohmic contact is easily formed. Furthermore, the P type diffusion layer 16 may also be used for formation of other elements.

The N⁺ type diffusion layer 17 functions as an N type contact region. That is, the N⁺ type diffusion layer 17 is a region necessary for the wiring (not illustrated) to form ohmic contact with the N type diffusion layer 14.

The P$^+$ type diffusion layer 18 functions as a P type contact region. That is, the P$^+$ type diffusion layer 18 is a region necessary for the wiring (not illustrated) to form ohmic contact with the P type diffusion layer 16.
(Manufacturing Method for Plurality of Floating Layers 8)

As described above, the plurality of floating layers 8, the main electrode 3 which is the first main electrode, and the main electrode 4 which is the second main electrode are provided on the same formation layer.

Therefore, for example, by executing the following steps S1 to S3 as a part of the method for manufacturing a semiconductor device in the first preferred embodiment, the plurality of floating layers 8, the main electrode 3, and the main electrode 4 can be simultaneously manufactured.

S1: Low-resistance doped polysilicon doped with N type doping at a high concentration is deposited on the insulating film 7, the insulating film 22, and the insulating film 23 provided above the P$^-$ type silicon substrate 19 to obtain a polysilicon layer having conductivity.

S2: A resist is patterned on the polysilicon layer obtained in step S1 by photoengraving.

S3: By executing anisotropic dry etching processing using the resist patterned in step S2 as a mask and etching the polysilicon layer obtained in step S1, the plurality of floating layers 8, the main electrode 3, and the main electrodes 4 are simultaneously obtained.

At this time, a constituent material of each of the plurality of floating layers 8, the main electrode 3, and the main electrode 4 becomes low-resistance doped polysilicon doped with N type doping at a high concentration. That is, the floating layers 8, the main electrode 3, and the main electrode 4 are formed of the same constituent material.

As described above, in the high withstand voltage semiconductor device 51 having the basic configuration of the first preferred embodiment, the plurality of floating layers 8 are formed simultaneously with the main electrode 3 and the main electrode 4 by executing the processing including steps S1 to S3 using the same constituent material.

In the resistive field plate 6, for example, an oxide film having a film thickness of about 50 nm is formed on the floating layers 8 using a thermal CVD method, and then a polysilicon layer including non-doped high-resistance polysilicon as a constituent material is deposited on the insulating film, and the polysilicon layer is adjusted to a desired resistance value by ion implantation. Thereafter, a planar-view pattern of a resist is formed by photolithography, and then isotropic dry etching processing is executed on the insulating film and the high-resistance polysilicon layer using the patterned resist as a mask to obtain the interlayer insulating film 10 and the resistive field plate 6.
(Effects)

In the basic configuration of the high withstand voltage semiconductor device 51 of the first preferred embodiment illustrated in FIGS. 1 to 3, the resistive field plate 6 has the floating step S8 reflecting the film thickness of the floating layer 8, so that the formation length increases and the resistance value increases.

Furthermore, since the floating layers 8 each having conductivity are provided on the same formation layer as the main electrode 3 and the main electrode 4, the plurality of floating layers 8 can be manufactured together when the main electrode 3 and the main electrode 4 are manufactured, so that an increase in process cost required for the manufacturing process can be suppressed.

That is, the method for manufacturing the high withstand voltage semiconductor device 51 of the first preferred embodiment includes step S1 of depositing a polysilicon layer having conductivity on the P$^-$ type silicon substrate 19, and steps S2 and S3 of patterning the polysilicon layer obtained in step S1 to simultaneously form the plurality of floating layers 8, the main electrode 3, and the main electrode 4.

As described above, in the method for manufacturing the semiconductor device of the first preferred embodiment, by executing steps S1 to S3 described above, the plurality of floating layers 8 can be formed together when the main electrode 3 and the main electrode 4 are formed. Therefore, since there is no need for an additional mask or an additional processing step for providing the plurality of floating layers 8, an increase in process cost can be suppressed.

As a result, the semiconductor device 51 of the first preferred embodiment can reduce the leakage current flowing between the main electrode 3 and the main electrode 4 in the withstand voltage structure using the resistive field plate 6 by suppressing an increase in process cost and increasing the resistance value of the resistive field plate 6.

In addition, in the high withstand voltage semiconductor device 51 of the first preferred embodiment, since the plurality of floating layers 8 are provided below the lap plate regions 61 to 63 serving as the plurality of lap plate regions, at least two floating steps S8 can be provided between one floating layer and the lap plate regions 61 to 63 in the resistive field plate 6.

For example, in FIG. 1, three floating steps S8 are provided between the floating layer 8 provided on the upper side on the +Y direction side and the lap plate regions 61 to 63, and two floating steps S8 are provided between the floating layer 8 provided on the lower side on the −Y direction side and the lap plate regions 61 and 62.

Therefore, in the high withstand voltage semiconductor device 51 of the first preferred embodiment, the formation length of the resistive field plate 6 can be effectively increased, and the resistance value of the resistive field plate 6 can be efficiently increased.

As described above, according to the high withstand voltage semiconductor device 51 of the first preferred embodiment, the resistive field plate 6 is formed in a mode in which the floating steps S8 are repeatedly generated along the lapping direction of the spiral. The resistance value of the resistive field plate 6 increases as a result of an increase in the formation length of the resistive field plate 6 in accordance with the number of floating steps SS generated.

As a result, the high withstand voltage semiconductor device 51 of the first preferred embodiment can reduce the leakage current and the power consumption at the time of holding the withstand voltage.
(Modification)

FIG. 4 is an explanatory view illustrating a top surface structure of a high withstand voltage semiconductor device 51B of a modification of the first preferred embodiment. FIG. 5 is a cross-sectional view illustrating a cross-sectional structure taken along line A2-A2 in FIG. 4, and an XYZ orthogonal coordinate system is described in each of FIGS. 4 and 5.

Hereinafter, features similar to those of the high withstand voltage semiconductor device 51 illustrated in FIGS. 1 to 3 will be denoted by the same reference numerals, description thereof will be omitted as appropriate, and feature portions of the high withstand voltage semiconductor device 51B will be mainly described.

In FIG. 5, the break line provided at the center of the high withstand voltage separation region WS is provided in consideration of the variations of structures in which the number of lap plate regions of the resistive field plate 6 exceeds "3". Hereinafter, description will be given on the assumption that the number of lap plate regions is the maximum "3" following the structure of FIG. 4.

As illustrated in FIG. 4, a plurality of MOSFETs 41 are provided in the high potential region 1, and a plurality of MOSFETs 42 are provided in the low potential region 2. FIG. 4 illustrates two MOSFETs 41 and four MOSFETs 42. The MOSFET 41 serves as a first MOSFET, and the MOSFET 42 serves as a second MOSFET. As described above, the high withstand voltage semiconductor device 51B includes the plurality of first and second MOSFETs.

Each of the plurality of MOSFETs 41 provided in the high potential region 1 has a gate electrode G1, a source region 82, and a drain region 83.

Each of the plurality of MOSFETs 42 provided in the low potential region 2 has a gate electrode G2, a source region 72, and a drain region 73.

As illustrated in FIG. 5, in the low potential region 2, the source regions 72 and the drain regions 73 which are each P$^+$ type are selectively provided on the upper layer portion of the N$^-$ type diffusion layer 12, and the gate electrodes G2 are each provided on the N$^-$ type diffusion layer 12 between the source region 72 and the drain region 73 via a gate oxide film 74.

Although not illustrated in FIG. 5, the MOSFET 41 formed in the high potential region 1 also has the same structure as the MOSFET 42. That is, in the MOSFET 41, the source regions 82 and the drain regions 83 each of which is P$^+$ type are selectively provided on the upper layer portion of the N$^-$ type diffusion layer 12, and the gate electrodes G2 are each provided on the N$^-$ type diffusion layer 12 between the source region 82 and the drain region 83 via a gate oxide film 84.

In the high withstand voltage semiconductor device SIB which is the modification, the plurality of floating layers 8, the gate electrode G1 of each of the plurality of MOSFETs 41, and the gate electrode G2 of each of the plurality of MOSFETs 42 are provided on the same formation layer.

(Manufacturing Method for Floating Layers 8)

As described above, in the high withstand voltage semiconductor device 51B of the modification, the floating layers 8 is provided on the same formation layer as the gate electrodes G1 of the MOSFETs 41 and the gate electrodes G2 of the MOSFETs 42, in addition to the main electrode 3 and the main electrode 4.

Therefore, for example, by executing the following steps S11 to S13 as a part of the method for manufacturing the semiconductor device in the modification of the first preferred embodiment, the plurality of floating layers 8, the main electrode 3, the main electrode 4, the gate electrodes G1 of the plurality of MOSFETs 41, and the gate electrodes G2 of the plurality of MOSFETs 42 can be manufactured.

S11: Low-resistance doped polysilicon doped with N type doping at a high concentration is deposited on the insulating film 7, the insulating film 22, the insulating film 23, the gate oxide film 74, and the gate oxide film 84 to obtain a polysilicon layer having conductivity.

S12: A resist is patterned on the polysilicon layer obtained in step S11 by photoengraving.

S13: By executing anisotropic dry etching processing using the resist patterned in step S12 as a mask and etching the polysilicon layer obtained in step S1, the plurality of floating layers 8, the main electrode 3, the main electrode 4, the gate electrodes G1 of the plurality of MOSFETs 41, and the gate electrodes G2 of the plurality of MOSFETs 42 are simultaneously obtained.

At this time, a constituent material of each of the plurality of floating layers 8, the main electrode 3, the main electrode 4, the gate electrodes G1 of the plurality of MOSFETs 41, and the gate electrodes G2 of the plurality of MOSFETs 42 becomes low-resistance doped polysilicon doped with N type doping at a high concentration. That is, the floating layers 8, the main electrode 3, the main electrode 4, and the gate electrodes G1 and G2 are formed of the same constituent material.

As described above, in the high withstand voltage semiconductor device 51B which is the modification of the first preferred embodiment, the floating layers 8 are formed simultaneously with the main electrode 3, the main electrode 4, the gate electrodes G1 of the MOSFETs 41, and the gate electrodes G2 of the MOSFETs 42 by executing the processing including steps S11 to S13 using the same constituent material.

The resistive field plate 6 is manufactured as follows, for example. First, an oxide film having a film thickness of about 50 nm is deposited on the floating layers 8 and the gate formation regions of the MOSFETs 41 and 42 using a thermal CVD method, and then non-doped high-resistance polysilicon is deposited on the insulating film to obtain a polysilicon layer. Thereafter, the polysilicon layer is adjusted to a desired resistance value by ion implantation. Thereafter, a planar-view pattern of a resist is formed by photolithography, and then isotropic dry etching processing is executed on the oxide film and the high-resistance polysilicon using the patterned resist as a mask to obtain the interlayer insulating film 10 and the resistive field plate 6.

(Effects)

As described above, in the high withstand voltage semiconductor device 51B which is the modification of the first preferred embodiment, the floating layers 8 are provided on the same formation layer as the gate electrodes G1 and G2 of the MOSFETs 41 and 42 serving as the first and second MOSFETs.

Therefore, in the high withstand voltage semiconductor device 51B, the plurality of floating layers 8 can be manufactured together when the main electrode 3, the main electrode 4, the plurality of gate electrodes G1, and the plurality of gate electrodes G2 are manufactured.

As a result, the high withstand voltage semiconductor device 51B which is the modification of the first preferred embodiment has a structure including MOSFETs in the high potential region 1 and the low potential region 2, and can suppress an increase in process cost required for the manufacturing process.

That is, by executing steps S11 to S13 described above as a part of the method for manufacturing the high withstand voltage semiconductor device 51B, the plurality of floating layers 8 can be formed together when the main electrode 3, the main electrode 4, the plurality of gate electrodes G1, and the plurality of gate electrodes G2 are formed.

Therefore, in the high withstand voltage semiconductor device SIB including the MOSFETs 41 and 42, since there is no need for an additional mask or an additional processing step for providing the plurality of floating layers 8, an increase in process cost can be suppressed.

In the high withstand voltage semiconductor device 51B, the floating layer 8 is formed of, for example, doped polysilicon which is the same constituent material as the gate electrode G1 and the gate electrode G2. Therefore, when the film thickness of the floating layer 8 is excessively increased, the processing accuracy required for the gate electrodes G1 and G2 is not satisfactory, and the chip size is greatly increased.

For this reason, after the thickness of the floating layer 8 in the modification is designed to satisfy the processing accuracy and the resistance value obtained for the gate electrodes G1 and G2, it is desirable that the thickness of the floating layer 8 follows the processing accuracy and the resistance value.

In the high withstand voltage semiconductor device 51B, the film thickness of the gate electrode of the MOSFET used for HVIC is generally 100 nm or more from the viewpoint of the required processing accuracy and the like. Therefore, as a modification of the first preferred embodiment, it is more preferable to design the film thickness of the floating layer 8 in consideration of the film thickness of the gate electrode. That is, the film thickness of the floating layer 8 is desirably set to be substantially equal to the film thicknesses of the gate electrodes G1 and G2 of the MOSFETs 41 and 42. In this case, the height difference of the floating step S8 is also about the same as the film thickness of the floating layer 8.

As described above, the film thicknesses of the gate electrode G1 and the gate electrode G2 are generally 100 nm or more. Therefore, by setting the film thickness of the floating layer 8 to 100 nm or more, which is about the same as the film thicknesses of the gate electrodes G1 and G2, it is possible to manufacture the high withstand voltage semiconductor device 51B of the modification without affecting the accuracies of the gate electrodes G1 and G2 of the MOSFETs 41 and 42. At this time, the height difference of the floating step S8 is also 100 nm or more.

(Variations in Shape and Film Thickness of Plurality of Floating Layers 8)

In the high withstand voltage semiconductor device 51 and the high withstand voltage semiconductor device 51B, each of the plurality of floating layers 8 illustrated in FIGS. 1 and 4 has a rectangular shape in plan view, and the plurality of floating layers 8 are radially arranged from the high potential region 1 to the low potential region 2.

However, the number of the plurality of floating layers 8, the planar shape of the plurality of floating layers 8, the formation interval of the plurality of floating layers 8, and the arrangement mode are not limited to the modes illustrated in FIGS. 1 to 5. For example, the planar shape of each of the plurality of floating layers 8 may be an octagonal shape obtained by cutting four corners of a rectangular pattern, or the shape of the four corners of the rectangular shape of each of the plurality of floating layers 8 may be curved in an arc shape.

In addition, the degree of density of the plurality of floating layers 8 may be adjusted, and for example, a limited number of floating layers 8 may be arranged only in a partial region of the outer periphery of the high potential region 1 without being arranged so as to surround the entire outer periphery of the high potential region 1. As a part of the outer periphery of the high potential region 1, for example, in a case where the high potential region 1 is close to a rectangular shape in plan view, it is conceivable that floating layers 8 may be arranged in one side of the high potential region 1.

However, the resistance value of the resistive field plate 6 increases according to the floating step S8 generated by the floating layers 8, and the effect of reducing the leakage current and the power consumption becomes significant. Therefore, it is desirable to densely arrange the plurality of floating layers 8 as long as the constraints such as process processing accuracy are satisfied.

As for the film thickness of the floating layer 8, the height difference of the floating step S8 generated by the floating layer 8 increases as the film thickness increases. As the height difference of the floating step S8 increases, the resistance value of the resistive field plate 6 also increases, and the effect of reducing the leakage current and the power consumption becomes remarkable.

However, when the film thickness of the floating layer 8 is increased, it is difficult to pattern the floating layer 8 itself and the resistive field plate 6 formed on the floating layer 8, which also causes an increase in process cost. In consideration of this point, it is desirable to appropriately set the film thickness of the floating layer 8.

Second Preferred Embodiment

FIG. 6 is an explanatory view illustrating a top surface structure of a high withstand voltage semiconductor device 52 which is a semiconductor device of a second preferred embodiment of the present disclosure. Similarly to the high withstand voltage semiconductor device 51 of the first preferred embodiment, the high withstand voltage semiconductor device 52 of the second preferred embodiment functions as an HVIC chip that drives and controls a power device such as an IGBT or a power MOSFET. FIG. 6 schematically illustrates the high potential region 1 and the low potential region 2, and the high withstand voltage separation region WS dividing these regions 1 and 2.

FIG. 7 is a cross-sectional view illustrating a cross-sectional structure taken along line C-C in FIG. 6, and FIG. 8 is a cross-sectional view illustrating a cross-sectional structure taken along line D-D in FIG. 6. An XYZ orthogonal coordinate system is illustrated in each of FIGS. 6 to 8.

Hereinafter, features similar to those of the high withstand voltage semiconductor device 51 as the basic configuration of the first preferred embodiment illustrated in FIGS. 1 to 3 will be denoted by the same reference numerals, description thereof will be omitted as appropriate, and feature portions of the high withstand voltage semiconductor device 52 will be mainly described.

The high withstand voltage semiconductor device 52 which is the semiconductor device of the second preferred embodiment includes a plurality of divided floating layers 20 separated from each other, and as illustrated in FIG. 6, the plurality of divided floating layers 20 have a relatively narrow dot shape in plan view.

In the high withstand voltage semiconductor device 52, similarly to the high withstand voltage semiconductor device 51, the low potential region 2 is provided to surround the high potential region 1 in plan view, and the resistive field plate 6 has a plurality of lap plate regions provided to lap around the high potential region 1 a plurality of times in plan view.

In the high withstand voltage semiconductor device 52 of the second preferred embodiment, each of the plurality of divided floating layers 20 is provided only below one of the plurality of lap plate regions.

As illustrated in FIG. 7, the resistive field plate 6 can be classified into the lap plate regions 61 to 63 from the high potential region 1 to the low potential region 2. In the resistive field plate 6, the lap plate region 61 serves as the innermost lap plate region, and the lap plate region 63 serves as the outermost lap plate region.

In FIG. 7, the break line provided at the center of the high withstand voltage separation region WS is provided in consideration of the variations of structures in which the number of lap plate regions of the resistive field plate 6 exceeds "3". Hereinafter, description will be given on the assumption that the number of lap plate regions is the maximum "3" following the structure of FIG. 6.

The three divided floating layers 20 illustrated in FIG. 7 can be classified into divided floating layers 201 to 203 from the high potential region 1 to the low potential region 2. Among the three divided floating layers 20, the divided floating layer 201 serves as the innermost divided floating layer 20, and the divided floating layer 203 serves as the outermost divided floating layer 20.

In the divided floating layers 201 to 203, the divided floating layer 201 is provided only below the lap plate region 61, the divided floating layer 202 is provided only below the lap plate region 62, and the divided floating layer 203 is provided only below the lap plate region 63.

(Effects)

In the high withstand voltage semiconductor device 52 of the second preferred embodiment, each of the plurality of divided floating layers 20 is provided only below one of the plurality of lap plate regions of the resistive field plate 6. That is, the number of floating steps S8 corresponding to the number of the plurality of divided floating layers 20 can be provided under the resistive field plate 6.

Therefore, in the high withstand voltage semiconductor device 52 of the second preferred embodiment, the formation length of the resistive field plate 6 can be further increased, and the resistance value of the resistive field plate 6 can be increased.

Furthermore, since the plurality of divided floating layers 20 each having conductivity are provided on the same formation layer as the main electrode 3 and the main electrode 4, similarly to the high withstand voltage semiconductor device 51 of the first preferred embodiment, the plurality of floating layers 8 can be manufactured together when the main electrode 3 and the main electrode 4 are manufactured, so that an increase in process cost required for the manufacturing process can be suppressed.

In addition, in the high withstand voltage semiconductor device 52 of the second preferred embodiment, the divided floating layer 20 on the high potential region side among the plurality of divided floating layers 20 is separated from other divided floating layers. Specifically, as illustrated in FIG. 7, the divided floating layer 201 is separated from the divided floating layers 202 and 203.

Therefore, in the high withstand voltage semiconductor device 52, even when the divided floating layer 201 serving as the divided floating layer 20 on the high potential region 1 side is capacitively coupled to have a relatively high high field plate potential, the high field plate potential is not transmitted to the divided floating layer 203 serving as the divided floating layer 20 on the low potential region side.

Therefore, the high withstand voltage semiconductor device 52 of the second preferred embodiment can suppress the occurrence of the imbalance phenomenon of the potential distribution in the high withstand voltage separation region WS, and can avoid the decrease in the withstand voltage of the device due to the imbalance phenomenon of the potential distribution.

Hereinafter, the above effect will be described in detail. In the high withstand voltage semiconductor devices 51 and 51B of the first preferred embodiment, one unit of the floating layer 8 extends from the high potential region 1 side toward the low potential region 2 side. Specifically, as illustrated in FIG. 2, one floating layer 8 is formed to extend from below the lap plate region 61 to below the lap plate region 63.

For this reason, when the floating layer 8 is capacitively coupled with the high potential region 1 to have a high field plate potential, the field plate potential increases up to a region close to the low potential region 2, and unbalance of the potential distribution of the entire high withstand voltage separation region WS occurs. As a result of the imbalance phenomenon of the potential distribution, the extension of the depletion layer in the N⁻ type diffusion layer 12 becomes uneven depending on the location, and as a result, there is a concern that the withstand voltages of the high withstand voltage semiconductor devices 51 and 51B decrease.

On the other hand, in the high withstand voltage semiconductor device 52 of the second preferred embodiment, the plurality of divided floating layers 20 each having a dot planar shape are divided, and the high field plate potential on the high potential region 1 side can be stepwisely decreased, so that the occurrence of the imbalance phenomenon of the potential distribution can be effectively suppressed.

As a result, in the high withstand voltage semiconductor device 52 of the second preferred embodiment, since the depletion layer in the N⁻ type diffusion layer 12 uniformly extends, it is possible to avoid a decrease in the withstand voltage.

In addition, since the plurality of divided floating layers 20 are provided in a dot shape each having a relatively small area, the degree of freedom in arrangement of the plurality of divided floating layers 20 is improved, and more divided floating layers 20 can be densely arranged along the lapping direction. Therefore, the high withstand voltage semiconductor device 52 of the second preferred embodiment can more remarkably exhibit the effect of reducing the leakage current and the power consumption of the resistive field plate 6.

In addition, also in the high withstand voltage semiconductor device 52 of the second preferred embodiment, it is possible to realize a high withstand voltage semiconductor device 52B of a modification like the high withstand voltage semiconductor device SIB illustrated in FIGS. 4 and 5.

That is, in the high withstand voltage semiconductor device 51B, the plurality of divided floating layers 20, the gate electrode G1 of each of the plurality of MOSFETs 41, and the gate electrode G2 of each of the plurality of MOSFETs 42 can be provided on the same formation layer.

(Variations in Shape and Film Thickness of Plurality of Divided Floating Layers 20)

In FIG. 6, the dot-shaped divided floating layers 20 are arranged at a constant density in a region between the high potential region 1 and the low potential region 2 as a quadrangular pattern in plan view, but in the second preferred embodiment, the number, interval, shape, and arrangement position of the divided floating layers 20 as viewed from the top surface of the chip are not limited.

For example, the planar shape of the divided floating layer 20 may be an octagonal pattern obtained by cutting four corners of a quadrangular pattern, or the shape of four corners of the divided floating layer 20 may be curved in an arc shape. Further, the degree of density of the dot-shaped divided floating layers 20 may be adjusted, and for example, the dot-shaped divided floating layers 20 may be arranged only in a part of the outer periphery of the high potential region 1 without being arranged so as to surround the entire outer periphery of the high potential region 1.

However, the resistance value of the resistive field plate 6 increases according to the number of the floating steps S8 generated by the plurality of divided floating layers 20, and the effect of reducing the leakage current and the power consumption becomes significant. Therefore, it is desirable to densely arrange the plurality of divided floating layers 20 as long as the constraints such as process processing accuracy are satisfied.

Third Preferred Embodiment

FIG. 9 is an explanatory view illustrating a top surface structure of a high withstand voltage semiconductor device 53 which is a semiconductor device of a third preferred embodiment of the present disclosure. Similarly to the high withstand voltage semiconductor device 51, the high withstand voltage semiconductor device 53 of the third preferred embodiment functions as an HVIC chip that drives and controls a power device such as an IGBT or a power MOSFET. FIG. 9 schematically illustrates the high potential region 1 and the low potential region 2, and the high withstand voltage separation region WS dividing these regions 1 and 2.

Figure 11:
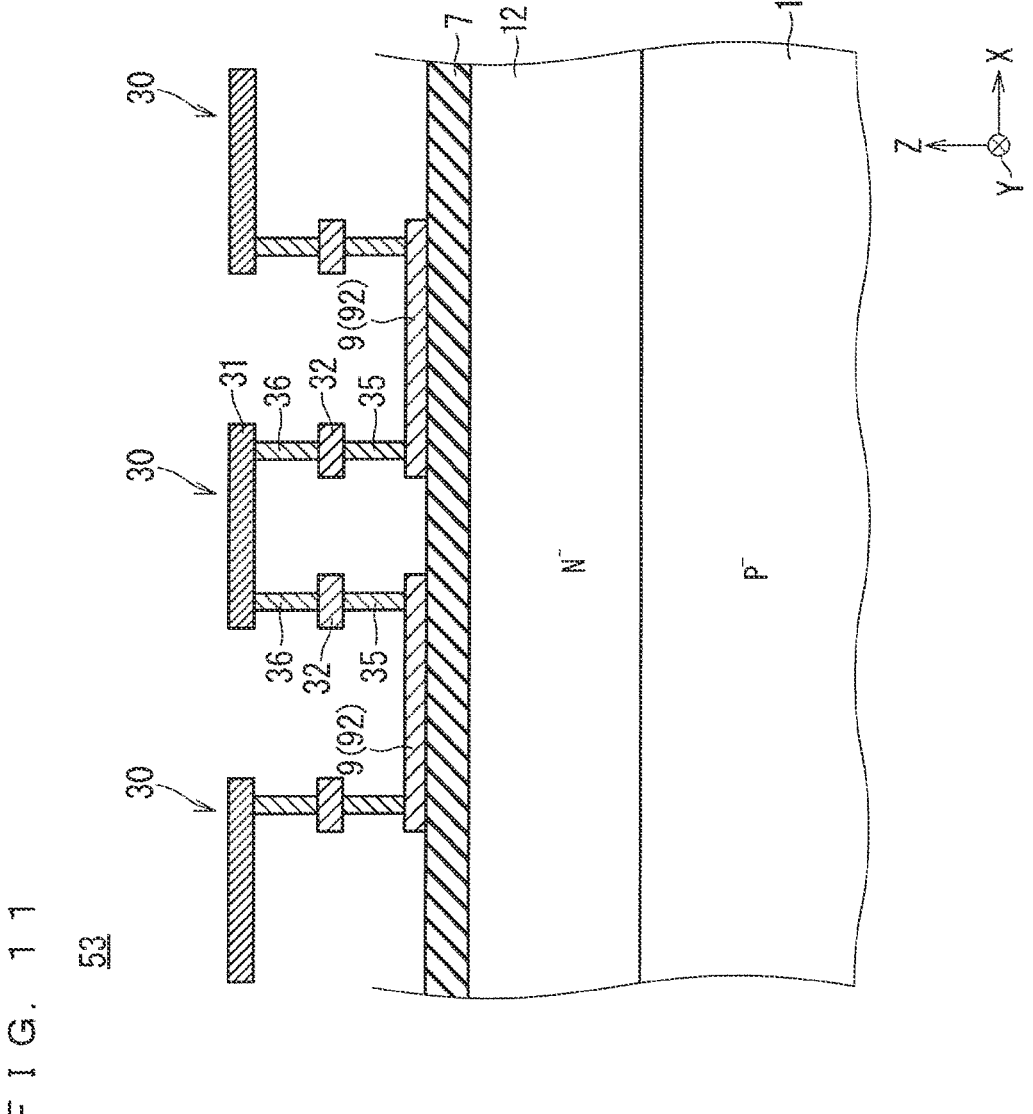
FIG. 11 is a cross-sectional view illustrating a cross-sectional structure taken along line F-F in FIG. 9.

FIG. 10 is a cross-sectional view illustrating a cross-sectional structure taken along line E-E in FIG. 9, and FIG. 11 is a cross-sectional view illustrating a cross-sectional structure taken along line F-F in FIG. 9. An XYZ orthogonal coordinate system is illustrated in each of FIGS. 9 to 11.

Hereinafter, features similar to those of the high withstand voltage semiconductor device 51 as the basic configuration of the first preferred embodiment illustrated in FIGS. 1 to 3 will be denoted by the same reference numerals, description thereof will be omitted as appropriate, and feature portions of the high withstand voltage semiconductor device 53 of the third preferred embodiment will be mainly described.

The high withstand voltage semiconductor device 53 which is the semiconductor device of the third preferred embodiment is not provided with the plurality of floating layers 8 or the plurality of divided floating layers 20 unlike the high withstand voltage semiconductor devices 51 and 51B of the first preferred embodiment and the high withstand voltage semiconductor device 52 of the second preferred embodiment.

In the high withstand voltage semiconductor device 53, in the high withstand voltage separation region WS, an inter-electrode connection portion electrically connecting the main electrode 3 serving as the first main electrode and the main electrode 4 serving as the second main electrode is provided.

The inter-electrode connection portion includes two jumper wirings 5, a plurality of divided resistive field plates 9, and a plurality of jumper wirings 30. Here, a combination of the plurality of divided resistive field plates 9 and the plurality of jumper wirings 30 is defined as a main wiring region. The main wiring region is provided in a spiral shape so as to surround the high potential region 1 in plan view.

In the third preferred embodiment, the plurality of divided resistive field plates 9, which are a plurality of thin film resistors, are all provided on the same formation layer, and the plurality of jumper wirings 30 function as at least one high-resistance connection member.

In the present specification, the "thin film resistor" means a resistor configured using a resistance material such as polysilicon. Therefore, a diffusion resistor using a diffusion layer of a semiconductor region is not included in the "thin film resistor". The resistive field plate 6 of the first preferred embodiment or the second preferred embodiment also serves as a thin film resistor.

Each of the plurality of divided resistive field plates 9 which are the plurality of thin film resistors is provided above the P type silicon substrate 19.

Among the two jumper wirings 5, the jumper wiring 5 on the high potential region 1 side is classified into a jumper wiring 5A, and the jumper wiring 5 on the low potential region 2 side is classified into a jumper wiring 5B. The jumper wiring 5A is electrically connected to the high potential region 1, and the jumper wiring 5B is electrically connected to the low potential region 2.

The plurality of divided resistive field plates 9 which are the plurality of thin film resistors are provided in the high withstand voltage separation region WS in a separated state. Each of the plurality of jumper wirings 30 functioning as at least one high-resistance connection member electrically connects a pair of divided resistive field plates 9 and 9 adjacent to each other in the lapping direction of the spiral among the plurality of divided resistive field plates 9.

In the main wiring region, an end portion on the high potential region 1 side is electrically connected to the jumper wiring 5A, and an end portion on the low potential region 2 side is electrically connected to the jumper wiring 5B.

Therefore, the main electrode 3 and the main electrode 4 are electrically connected by the inter-electrode connection portion including the two jumper wirings 5, the plurality of divided resistive field plates 9, and the plurality of jumper wirings 30 described above. The main electrode 3 and the main electrode 4 are each made of doped polysilicon.

As described above, the main wiring region including the plurality of divided resistive field plates 9 and the plurality of jumper wirings 30 is arranged in a spiral shape in plan view so as to gradually approach the inner main electrode 3 from the outer main electrode 4. As described above, since the main wiring region is provided to lap around the high potential region 1 a plurality of times in plan view, the resistive field plate 6 is classified into a plurality of lap plate regions corresponding to the number of laps.

For example, the three divided resistive field plates 9 illustrated in FIG. 10 can be classified into lap plate regions 91 to 93 from the high potential region 1 to the low potential region 2. Among the three lap plate regions 91 to 93 illustrated in FIG. 10, the lap plate region 91 serves as the innermost lap plate region, and the lap plate region 93 serves as the outermost lap plate region.

In FIG. 10, the break line provided at the center of the high withstand voltage separation region WS is provided in consideration of the variations of structures in which the number of lap plate regions by the main wiring region including the plurality of divided resistive field plates 9 exceeds "3". Hereinafter, description will be given on the assumption that the number of lap plate regions is the maximum "3" following the structure of FIG. 9.

As illustrated in FIG. 11, each of the plurality of jumper wirings 30 includes an uppermost wiring layer 31, a pair of intermediate wiring layers 32, a pair of contact holes 35, and a pair of through holes 36 as main components. The intermediate wiring layer 32 serves as a first-layer metal wiring, and the uppermost wiring layer 31 serves as a second-layer metal wiring. As described above, the jumper wiring 30 has a stacked structure including the first and second-layer metal wirings arranged above the divided resistive field plate 9. Here, the "stacked structure" means a structure having a plurality of metal wiring layers existing above a connection target such as the divided resistive field plate 9.

One of the pair of contact holes 35 is provided to be electrically connected to one of the divided resistive field plates 9 and 9 adjacent to each other, and the other is provided to be electrically connected to the other of the divided resistive field plates 9 and 9 adjacent to each other.

One of the pair of contact holes 35 is electrically connected to one end of the uppermost wiring layer 31 via the corresponding intermediate wiring layer 32 of the pair of intermediate wiring layers 32 and the corresponding through hole 36 of the pair of through holes 36. The other of the pair of contact holes 35 is electrically connected to the other end of the uppermost wiring layer 31 via the corresponding intermediate wiring layer 32 of the pair of intermediate wiring layers 32 and the corresponding through hole 36 of the pair of through holes 36.

The uppermost wiring layer 31, the intermediate wiring layer 32, the contact hole 35, and the through hole 36 are each made of, for example, a metal such as AlSi, AlSiCu, AlCu, or W (tungsten).

Therefore, the pair of divided resistive field plates 9 and 9 arranged adjacent to each other without being in contact with each other in the lapping direction are electrically connected by the jumper wiring 30. The electrical connection path in the jumper wiring 30 is one contact hole 35, one intermediate wiring layer 32, one through hole 36, the uppermost wiring layer 31, the other through hole 36, the other intermediate wiring layer 32, and the other contact hole 35.

As described above, the plurality of jumper wirings 30 which are at least one high-resistance connection member electrically connect the divided resistive field plates 9 and 9 adjacent to each other in the lapping direction.

As described above, in the high withstand voltage semiconductor device 53 of the third preferred embodiment, as compared with the high withstand voltage semiconductor devices 51 and 52 of the first and second preferred embodiments, the plurality of divided resistive field plates 9 formed in a single layer are separated and divided without providing the floating layer 8 or the divided floating layer 20, and the pair of divided resistive field plates 9 and 9 are electrically connected by the jumper wiring 30.

(Effects)

In the high withstand voltage semiconductor device 53 of the third preferred embodiment, the pair of divided resistive field plates 9 and 9 adjacent to each other in the lapping direction among the plurality of divided resistive field plates 9 which are the plurality of thin film resistors are electrically connected by the jumper wiring 30 which is the high-resistance connection member.

As illustrated in FIG. 11, the jumper wiring 30 is formed in a stacked structure including the uppermost wiring layer 31 and the intermediate wiring layer 32, and can be set to a relatively high resistance value by electrically connecting the divided resistive field plates 9 and 9 adjacent to each other via many components. Specifically, the resistance value of the jumper wiring 30 can be relatively easily increased by making the metal wiring of the jumper wiring 30 multilayered or narrowing the width of the constituent members.

Note that at least one of the uppermost wiring layer 31, the pair of contact holes 35, the pair of through holes 36, and the pair of intermediate wiring layers 32 corresponds to a constituent member of the jumper wiring 30.

Therefore, the resistance value of the main wiring region can be increased by increasing the resistance value of each of the plurality of jumper wirings 30 serving as at least one high-resistance connection member.

As a result, the high withstand voltage semiconductor device 53 of the third preferred embodiment can reduce the leakage current flowing between the main electrode 3 and the main electrode 4 in the withstand voltage structure using the plurality of divided resistive field plates 9 which are the plurality of thin film resistors by increasing the resistance value of the main wiring region.

Furthermore, in the high withstand voltage semiconductor device 53 of the third preferred embodiment, when the resistance value of the main wiring region increases, an increase in cost required for the manufacturing process of the high withstand voltage semiconductor device 53 can be suppressed because components other than the main wiring region are not used.

Note that the floating layer 8 of the first preferred embodiment and the divided floating layer 20 of the second preferred embodiment correspond to the components other than the main wiring region.

Further, since the plurality of divided resistive field plates 9 are provided on the same formation layer, the high withstand voltage semiconductor device 53 of the fifth preferred embodiment can simultaneously form the plurality of divided resistive field plates 9.

Therefore, an increase in the process cost required for the manufacturing process of the plurality of divided resistive field plates 9 can be suppressed.

(Modification)

FIG. 12 is an explanatory view illustrating a top surface structure of a high withstand voltage semiconductor device 53B which is a modification of the third preferred embodiment. An XYZ orthogonal coordinate system is illustrated in FIG. 12.

Hereinafter, features similar to those of the high withstand voltage semiconductor device 53 illustrated in FIGS. 9 to 11 will be denoted by the same reference numerals, description thereof will be omitted as appropriate, and feature portions of the high withstand voltage semiconductor device 53B will be mainly described. Note that a cross section taken along line E-E in FIG. 12 corresponds to FIG. 10, and a cross section taken along line F-F in FIG. 12 corresponds to FIG. 11.

As illustrated in FIG. 12, the plurality of MOSFETs 41 are provided in the high potential region 1, and the plurality of MOSFETs 42 are provided in the low potential region 2. FIG. 12 illustrates two MOSFETs 41 and four MOSFETs 42. The MOSFET 41 serves as a first MOSFET, and the MOSFET 42 serves as a second MOSFET.

Each of the plurality of MOSFETs 41 provided in the high potential region 1 has a gate electrode G1, a source region 82, and a drain region 83. The gate electrodes G1 and G1 of the plurality of MOSFETs 41 are electrically connected by a gate wiring LG1. The gate wiring LG1 serves as a first gate wiring layer that connects the gate electrodes of the plurality of first MOSFETs. In FIG. 12, the gate electrodes G1 and G1 of the pair of MOSFETs 41 are electrically connected by the gate wiring LG1 which is the first gate wiring layer.

Each of the plurality of MOSFETs 42 provided in the low potential region 2 has a gate electrode G2, a source region 72, and a drain region 73. The gate electrodes G2 and G2 of the plurality of MOSFETs 42 are electrically connected by a gate wiring LG2. The gate wiring LG2 serves as a second gate wiring layer between the gate electrodes of the plurality of second MOSFETs. In FIG. 12, the gate electrodes G2 and G2 of the two pairs of MOSFETs 42 are each electrically connected by the gate wiring LG2 which is the second gate wiring layer.

At least one wiring layer of the uppermost wiring layer 31 and the intermediate wiring layer 32 of the jumper wiring 30 is defined as a simultaneous manufacturing wiring layer. In the high withstand voltage semiconductor device 53B which is the modification, the simultaneous manufacturing wiring layer of the jumper wiring 30, the gate wiring LG1 of each of the plurality of MOSFETs 41, and the gate wiring LG2 of each of the plurality of MOSFETs 42 are provided on the same formation layer.

(Manufacturing Method for Intermediate Wiring Layer 32 in Jumper Wiring 30)

Here, a manufacturing method for the intermediate wiring layer 32 will be described on the assumption that the intermediate wiring layer 32 of each of the plurality of jumper wirings 30 serves as a simultaneous manufacturing wiring layer.

In the case of the above assumption, for example, by executing the following steps S21 to S23 as a part of the method for manufacturing the semiconductor device of the third preferred embodiment, the intermediate wiring layer 32 which is the simultaneous manufacturing wiring layer and the gate wirings LG1 and LG2 can be manufactured. Here, it is assumed that the divided resistive field plates 9 and the gate electrodes G1 and G2 have already been formed before the execution of steps S21 to S23.

S21: An interlayer insulating film is formed on the divided resistive field plates 9 and the gate electrodes G1 and G2, and contact holes for the gate electrodes G31 and G2 and the contact holes 35 penetrating the interlayer insulating film are selectively formed. Thereafter, a metal material is deposited on the interlayer insulating film including the contact holes for the gate electrodes G1 and G2 and the contact holes 35 to obtain a metal layer.

S22: A resist is patterned on the metal layer obtained in step S21 by photoengraving.

S23: By executing anisotropic dry etching processing using the resist patterned in step S22 as a mask and etching the metal layer obtained in step S21, the intermediate wiring layer 32 and the gate wirings LG1 and LG2 are simultaneously obtained.

As described above, in the high withstand voltage semiconductor device 53 which is the modification of the third preferred embodiment, the intermediate wiring layer 32 of the jumper wiring 30 can be formed simultaneously with the gate wiring LG1 and the gate wiring LG2 by executing the processing including steps S21 to S23 using the metal material having the same constituent material.

(Effects)

As described above, in the high withstand voltage semiconductor device 53B which is the modification of the third preferred embodiment, the simultaneous manufacturing wiring layer of each of the plurality of jumper wirings 30 serving as at least one high-resistance connection member is provided on the same formation layer as the gate wirings LG1 and LG2 of each of the plurality of MOSFETs 41 and 42. Here, the simultaneous manufacturing wiring layer serves as at least one of the uppermost wiring layer 31 and the intermediate wiring layer 32.

Therefore, when the gate wirings LG1 and LG2 of each of the plurality of MOSFETs 41 and 42 are manufactured, the simultaneous manufacturing wiring layer of each of the plurality of jumper wirings 30 can be manufactured together.

Therefore, the high withstand voltage semiconductor device 53B which is the modification of the third preferred embodiment can suppress an increase in process cost required for the manufacturing process.

That is, by executing steps S21 to S23 described above as a part of the method for manufacturing the semiconductor device of the third preferred embodiment, the simultaneous manufacturing wiring layer of each of the plurality of jumper wirings 30 can be formed when the gate wiring LG1 and the gate wiring LG2 are formed.

Therefore, the method for manufacturing the semiconductor device of the third preferred embodiment can suppress an increase in process cost required for the high withstand voltage semiconductor device 53B by suppressing an additional mask for providing the plurality of jumper wirings 30 and an additional processing step to the minimum necessary.

(Variations in Jumper Wiring 30)

In FIG. 11, the jumper wiring 30 is formed by the pair of contact holes 35, the pair of intermediate wiring layers 32 serving as the first-layer metal wirings, the uppermost wiring layer 31 serving as the second-layer metal wiring, and the pair of through holes 36.

The number of metal wiring layers may be further increased instead of the stacked structure of the jumper wiring 30 illustrated in FIG. 11. However, in order to reduce the leakage current and the power consumption in the main wiring region, it is desirable to form a stacked structure of the jumper wiring 30 using a multilayer metal wiring. However, if the stacked structure in the jumper wiring 30 is made multilayered, the process cost increases, and thus it is preferable to make the jumper wiring 30 multilayered within the range of the number of wiring layers necessary for forming other circuit regions.

In addition, in FIG. 9, the plurality of jumper wirings 30 are symmetrically arranged on the entire outer periphery of the high potential region 1 in plan view, but the present invention is not limited to this structure, and the number, interval, and arrangement position of the jumper wirings 30 in plan view are not limited. For example, the plurality of jumper wirings 30 may be arranged only in a part of the outer periphery of the high potential region 1 without being arranged so as to surround the entire outer periphery of the high potential region 1. However, the resistance value of the main wiring region increases according to the number of the jumper wirings 30 and the effect of reducing the leakage current and the power consumption becomes significant. Therefore, it is desirable to densely arrange the plurality of jumper wirings 30 as long as the constraints such as process processing accuracy are satisfied.

Fourth Preferred Embodiment

Figure 13:
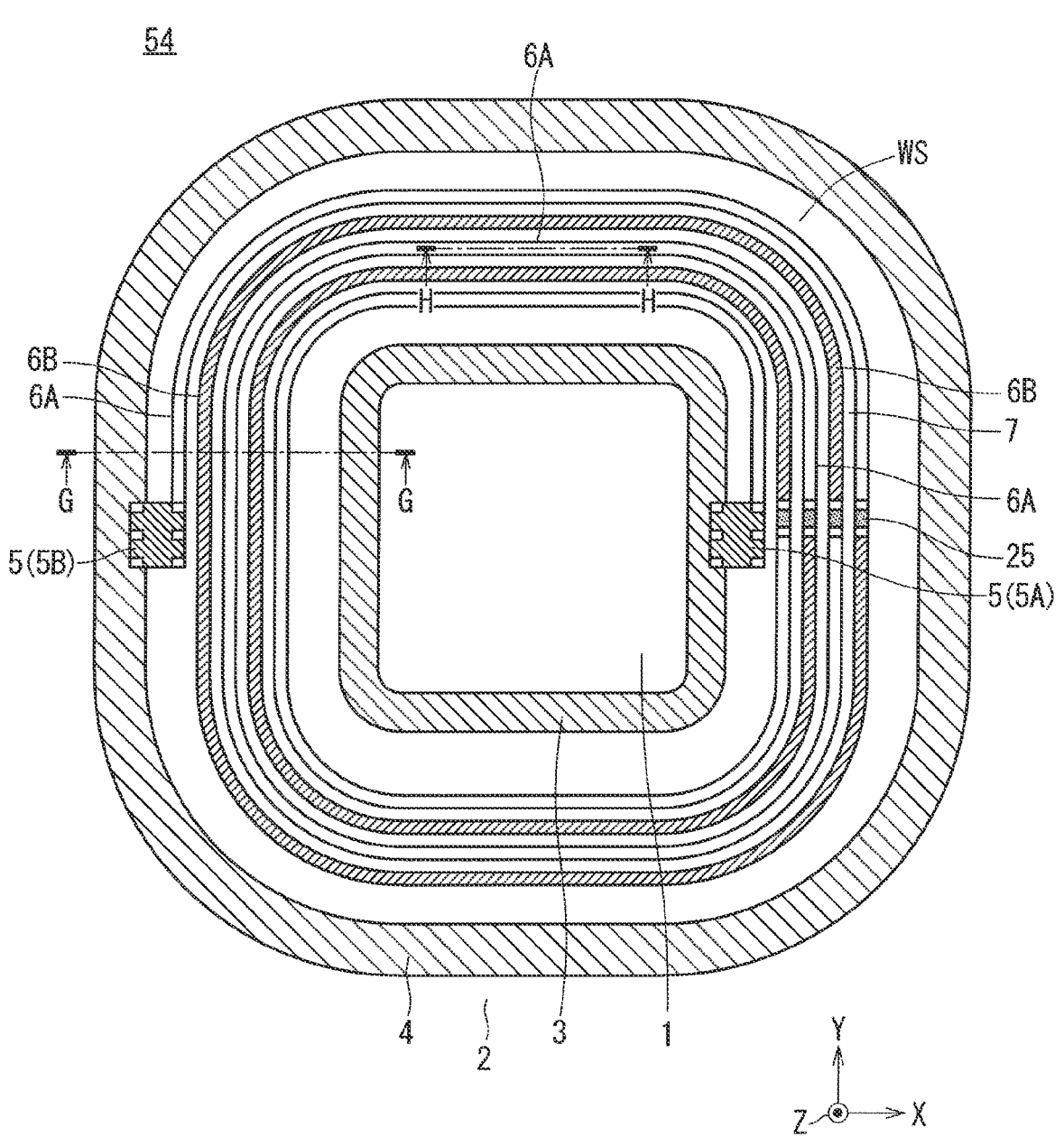
FIG. 13 is an explanatory view illustrating a top surface structure of a high withstand voltage semiconductor device which is a fourth preferred embodiment.

FIG. 13 is an explanatory view illustrating a top surface structure of a high withstand voltage semiconductor device 54 which is a semiconductor device of a fourth preferred embodiment of the present disclosure. Similarly to the high withstand voltage semiconductor devices 51 to 53, the high withstand voltage semiconductor device 54 of the fourth preferred embodiment functions as an HVIC chip that drives and controls a power device such as an IGBT or a power MOSFET. FIG. 13 schematically illustrates the high potential region 1 and the low potential region 2, and the high withstand voltage separation region WS dividing these regions 1 and 2.

FIG. 14 is a cross-sectional view illustrating a cross-sectional structure taken along line G-G in FIG. 13, and FIG. 15 is a cross-sectional view illustrating a cross-sectional structure taken along line H-H in FIG. 13. An XYZ orthogonal coordinate system is illustrated in each of FIGS. 13 to 15.

Hereinafter, features similar to those of the high withstand voltage semiconductor device 51 as the basic configuration of the first preferred embodiment illustrated in FIGS. 1 to 3 will be denoted by the same reference numerals, description thereof will be omitted as appropriate, and feature portions of the high withstand voltage semiconductor device 54 will be mainly described.

The high withstand voltage semiconductor device 54 which is the semiconductor device of the fourth preferred embodiment is not provided with the plurality of floating layers 8 or the plurality of divided floating layers 20 unlike the high withstand voltage semiconductor devices 51 and 51B of the first preferred embodiment and the high withstand voltage semiconductor device 52 of the second preferred embodiment.

In the high withstand voltage semiconductor device 54, in the high withstand voltage separation region WS, an inter-electrode connection portion electrically connecting the main electrode 3 serving as the first main electrode and the main electrode 4 serving as the second main electrode is provided.

The inter-electrode connection portion includes two jumper wirings 5, a plurality of divided resistive field plates 6A, a plurality of divided resistive field plates 6B, and a plurality of jumper wirings 25. Here, a combination of the plurality of divided resistive field plates 6A, the plurality of divided resistive field plates 6B, and the plurality of jumper wirings 25 is defined as a main wiring region. The main wiring region is provided in a spiral shape so as to surround the high potential region 1 in plan view.

In the fourth preferred embodiment, a plurality of divided resistive field plates 6A and 6B provided in different formation layers are provided as the plurality of thin film resistor. In addition, the plurality of jumper wirings 25 function as at least one high-resistance connection member, the plurality of divided resistive field plates 6A are classified into a plurality of first divided resistive field plates, and the plurality of divided resistive field plates 6B are classified into second divided resistive field plates.

In order to prevent a short circuit between the plurality of divided resistive field plates 6A and the plurality of divided resistive field plates 6B, an interlayer insulating film (not illustrated in FIGS. 14 and 15) is provided between the divided resistive field plate 6A and the divided resistive field plate 6B. This interlayer insulating film corresponds to an interlayer insulating film 28 of a modification illustrated in FIG. 16 described later. As described above, the plurality of divided resistive field plates 6A and the plurality of divided resistive field plates 6B have different formation layers, and are manufactured by different processing steps.

Each of the plurality of divided resistive field plates 6A and 6B which are the plurality of thin film resistors is provided above the P⁻ type silicon substrate 19. As described above, the high withstand voltage semiconductor device 54 of the fourth preferred embodiment includes the plurality of divided resistive field plates 6A and 6B as the plurality of thin film resistors having different formation layers.

Among the two jumper wirings 5, the jumper wiring 5 on the high potential region 1 side is classified into the jumper wiring 5A, and the jumper wiring 5 on the low potential region 2 side is classified into the jumper wiring 5B. The jumper wiring 5A is electrically connected to the high potential region 1, and the jumper wiring 5B is electrically connected to the low potential region 2.

The plurality of divided resistive field plates 6A, which are the plurality of first divided resistive field plates, are provided in the high withstand voltage separation region WS in a separated state. Similarly, the plurality of divided resistive field plates 6B, which are the plurality of second divided resistive field plates, are provided in the high withstand voltage separation region WS in a separated state.

The plurality of jumper wirings 25 are provided in the high withstand voltage separation region WS as at least one high-resistance connection member. In FIG. 13, four jumper wirings 25 are illustrated.

Each of the plurality of jumper wirings 25 electrically connects the divided resistive field plates 6A and 6B adjacent to each other in the lapping direction of the spiral among the plurality of divided resistive field plates 6A and 6B.

For example, the jumper wiring 25 located on the outermost side on the low potential region 2 side electrically connects the divided resistive field plate 6A and the divided resistive field plate 6B arranged on the outermost periphery.

In the main wiring region, an end portion on the high potential region 1 side is electrically connected to the jumper wiring 5A, and an end portion on the low potential region 2 side is electrically connected to the jumper wiring 5B. In FIG. 13, the divided resistive field plate 6A arranged on the innermost side is electrically connected to the jumper wiring 5A, and the divided resistive field plate 6A arranged on the outermost side is electrically connected to the jumper wiring 5B.

The main electrode 3 and the main electrode 4 are electrically connected by the inter-electrode connection portion including the two jumper wirings 5, the plurality of divided resistive field plates 6A and 6B, and the plurality of jumper wirings 25 described above. The main electrode 3 and the main electrode 4 are each made of doped polysilicon.

As described above, the main wiring region is arranged in a spiral shape in plan view so as to gradually approach the inner main electrode 3 from the outer main electrode 4. As described above, since the main wiring region is provided to lap around the high potential region 1 a plurality of times in plan view, the resistive field plate 6 is classified into a plurality of lap plate regions corresponding to the number of laps.

Further, the main wiring region is provided to lap around the high potential region 1 a plurality of times in plan view so that the divided resistive field plate 6A serving as the first divided resistive field plate and the divided resistive field plate 6B serving as the second divided resistive field plate alternately lap around.

For example, the three divided resistive field plates 6A and the two divided resistive field plates 6B illustrated in FIG. 14 can be classified into lap plate regions 61 to 65 from the high potential region 1 to the low potential region 2. In the three divided resistive field plates 6A illustrated in FIG. 14, the lap plate region 61 serves as the innermost lap plate region, and the lap plate region 65 serves as the outermost lap plate region.

Thus, the three divided resistive field plates 6A and the two divided resistive field plates 6B alternately lap in the order of the divided resistive field plates 6A, 6B, 6A, 6B, and 6A from the innermost side to the outermost side.

Note that, in FIG. 14, the break line provided at the center of the high withstand voltage separation region WS is provided in consideration of the variations of structures in which the number of lap plate regions by the main wiring region including the plurality of divided resistive field plates 6A and 6B exceeds "5". Hereinafter, description will be given on the assumption that the number of lap plate regions is the maximum "5" following the structure of FIG. 13.

The plurality of jumper wirings 25 have a stacked structure including a plurality of metal wiring layers. For example, as in a jumper wiring 30 illustrated in FIG. 12, a stacked structure including the uppermost wiring layer 31 serving as the second-layer metal wiring and the pair of intermediate wiring layers 32 serving as the first-layer metal wirings is conceivable.

When the structure of the jumper wiring 25 is similar to the structure of the jumper wiring 30 illustrated in FIG. 12, the electrical connection path in the jumper wiring 25 is one contact hole 35, one intermediate wiring layer 32, one through hole 36, the uppermost wiring layer 31, the other through hole 36, the other intermediate wiring layer 32, and the other contact hole 35.

As described above, the plurality of jumper wirings 25, which are at least one high-resistance connection member, electrically connect the divided resistive field plates 6A and 6B adjacent to each other in the lapping direction.

Further, the plurality of divided resistive field plates 6B, the main electrode 3, and the main electrode 4 are provided on the same formation layer. That is, among the plurality of divided resistive field plates 6A and the plurality of divided resistive field plates 6B, the plurality of divided resistive field plates 6B are defined as a plurality of simultaneously manufactured divided resistive field plates.

The plurality of divided resistive field plates 6B, which are the plurality of simultaneously manufactured divided resistive field plates, are provided on the same formation layer as the main electrode 3 serving as the first main electrode and the main electrode 4 serving as the second main electrode.

(Manufacturing Method for Plurality of Divided Resistive Field Plates 6B)

Here, a manufacturing method for a plurality of divided resistive field plates 6B which are the plurality of simultaneously manufactured divided resistive field plates will be described. For example, by executing the following steps S31 to S33 as a part of the method for manufacturing a semiconductor device of the fourth preferred embodiment, the plurality of divided resistive field plates 6A, the main electrode 3, and the main electrode 4 can be simultaneously manufactured.

S31: Low-resistance doped polysilicon doped with N type doping at a high concentration is deposited on the insulating film 7, the insulating film 22, and the insulating film 23 to obtain a polysilicon layer having conductivity.

S32: A resist is patterned on the polysilicon layer obtained in step S31 by photoengraving.

S33: By executing anisotropic dry etching processing using the resist patterned in step S32 as a mask and etching the polysilicon layer obtained in step S31, the plurality of divided resistive field plates 6B, the main electrode 3, and the main electrode 4 are simultaneously obtained.

As described above, in the high withstand voltage semiconductor device 54 of the fourth preferred embodiment, the divided resistive field plate 6B is formed simultaneously with the main electrode 3 and the main electrode 4 by executing the processing including steps S31 to S23 using the same constituent material.

In the divided resistive field plate 6A, for example, an interlayer insulating film having a film thickness of about 50 nm is deposited on the divided resistive field plate 6B for insulation from the divided resistive field plate 6B by using, for example, a thermal CVD method, and then non-doped high-resistive polysilicon is deposited on the interlayer insulating film to obtain a polysilicon layer. Then, the polysilicon layer is adjusted to a desired resistance value by ion implantation. Thereafter, a planar-view pattern of a resist is formed by photolithography, and then isotropic dry etching processing is executed on the polysilicon layer using the patterned resist as a mask to obtain the divided resistive field plate 6A.

Therefore, the divided resistive field plate 6A and the divided resistive field plate 6B are completely separated by the interlayer insulating film. That is, the plurality of divided resistive field plates 6A and the plurality of divided resistive field plates 6B are formed in different formation layers.

The divided resistive field plate 6B has a lower resistivity than the divided resistive field plate 6A.

In FIGS. 14 and 15, illustration of the above-described interlayer insulating film that insulates and separates the divided resistive field plate 6A and the divided resistive field plate 6B is omitted. For this reason, in FIG. 14, the formation heights of the divided resistive field plate 6A and the divided resistive field plate 6B are illustrated to be approximately the same in appearance.

(Effects)

In the high withstand voltage semiconductor device 54 of the fourth preferred embodiment, the divided resistive field plates 6A and 6B, which are a pair of thin film resistors adjacent to each other, are electrically connected by the jumper wiring 25, which is a high-resistance connection member.

Similarly to the jumper wiring 30 of the third preferred embodiment, the jumper wiring 25 is formed in a stacked structure, and can be set to a relatively high resistance value by electrically connecting the divided resistive field plates 6A and 6B adjacent to each other via many components. That is, similarly to the jumper wiring 30 described in the third preferred embodiment, the resistance value of the jumper wiring 25 can be relatively easily increased by making the wiring layer multilayered, narrowing the width of the constituent members, or the like.

As described above, in the high withstand voltage semiconductor device 54 of the fourth preferred embodiment, each of the plurality of jumper wirings 25 electrically connects the divided resistive field plate 6A and the divided resistive field plate 6B that are adjacent to each other among the plurality of divided resistive field plates 6A and 6B. Therefore, the resistance value of the main wiring region can be increased by increasing the resistance value of each of the plurality of jumper wirings 25.

As a result, the high withstand voltage semiconductor device 54 of the fourth preferred embodiment can reduce the leakage current flowing between the main electrode 3 serving as the first main electrode and the main electrode 4 serving as the second main electrode by increasing the resistance value of the main wiring region.

The main wiring region is provided to lap around the high potential region 1 a plurality of times in plan view so that the divided resistive field plate 6A which is the first divided resistive field plate and the divided resistive field plate 6B which is the second divided resistive field plate alternately lap around.

For this reason, a first processing interval between the divided resistive field plates 6A and 6A adjacent to each other in the lapping direction among the plurality of divided resistive field plates 6A and a second processing interval between the divided resistive field plates 6B and 6B adjacent to each other in the lapping direction among the plurality of divided resistive field plates 6B can have a margin. Here, the first and second processing intervals are directions along the lapping transverse direction orthogonal to the lapping direction.

For example, in the structure illustrated in FIG. 14, the Y direction serves as the lapping direction, and the X direction serves as the lapping transverse direction. In the example illustrated in FIG. 14, even if a distance d6A between the divided resistive field plates 6A and 6A adjacent to each other in the X direction and a distance d6B between the divided resistive field plates 6B and 6B adjacent to each other in the X direction are set to be relatively long, the distance d6 between the divided resistive field plates 6A and 6B adjacent to each other in the X direction can be made sufficiently short.

As a result, the high withstand voltage semiconductor device 54 of the fourth preferred embodiment can cause the divided resistive field plates 6A and the divided resistive field plates 6B to alternately lap at a relatively narrow distance d6 along the above-described lapping direction, and can accurately manufacture the plurality of divided resistive field plates 6A arranged at the distance d6A interval and the plurality of divided resistive field plates 6B arranged at the distance d6B interval.

On the other hand, in the high withstand voltage semiconductor device 53 of the third preferred embodiment, a case will be considered in which a distance d9 in the lapping transverse direction of the plurality of divided resistive field plates 9 formed on the same formation layer illustrated in FIG. 10 is set to be substantially the same as a distance d6 illustrated in FIG. 14.

In this case, there is a considerable possibility that an problem occurs in which an unintended region between the pair of divided resistive field plates 9 and 9 adjacent to each other in the lapping transverse direction is short-circuited due to the restriction of the process processing accuracy of the plurality of divided resistive field plates 9. As a cause of the above-described problem, a bridge to which an unintended portion of the resist serving as a mask is connected, a difficulty in etching a narrow opening portion between the resists, and the like are considered.

On the other hand, according to the high withstand voltage semiconductor device 54 of the fourth preferred embodiment, by arranging the divided resistive field plate 6B in the region that has been the gap between the divided resistive field plates 6A and 6A due to the restriction on the process processing accuracy, even if the distance d6 between the divided resistive field plates 6A and 6B in the lapping transverse direction is sufficiently shortened, the above-described problem does not occur.

Therefore, as compared with the high withstand voltage semiconductor device 53 of the third preferred embodiment including the plurality of divided resistive field plates 9 provided on the same formation layer, the high withstand voltage semiconductor device 54 can increase the resistance value of the entire main wiring region by forming the formation length of the main wiring region sufficiently long by densifying between the divided resistive field plates 6A and 6B, and can reduce the leakage current and the power consumption at the time of holding the withstand voltage.

Since the divided resistive field plate 6B serving as the simultaneously manufactured divided resistive field plate is provided on the same formation layer as the main electrode 3 and the main electrode 4 which are the first and second main electrodes, the divided resistive field plate 6B can be manufactured together when the main electrode 3 and the main electrode 4 are manufactured.

That is, the method for manufacturing the high withstand voltage semiconductor device 54 of the fourth preferred embodiment includes step S31 of obtaining a polysilicon layer having conductivity on the P$^-$ type silicon substrate 19, and steps S32 and S33 of patterning the polysilicon layer obtained in step S21 to simultaneously form the plurality of divided resistive field plates 6B, the main electrode 3, and the main electrode 4.

As described above, in the method for manufacturing the semiconductor device of the fourth preferred embodiment, by executing steps S31 to S33 described above, the plurality of divided resistive field plates 6B can be formed together when the main electrode 3 and the main electrode 4 are formed. Therefore, since there is no need for an additional mask or an additional processing step for providing the plurality of divided resistive field plates 6B, an increase in process cost can be suppressed.

Therefore, an increase in process cost required for the manufacturing process of the high withstand voltage semiconductor device 54 of the fourth preferred embodiment can be minimized.

(Modification)

In the high withstand voltage semiconductor device 54 having the basic configuration of the fourth preferred embodiment, the structure in which the divided resistive field plate 6A and the divided resistive field plate 6B do not overlap each other in the thickness direction of the P$^-$ type silicon substrate 19, that is, do not overlap each other in plan view has been described.

In the modification described below, a structure in which the divided resistive field plate 6A and the divided resistive field plate 6B partially overlap each other in the thickness direction of the P$^-$ type silicon substrate 19, that is, overlap each other in plan view is described.

FIG. 16 is a cross-sectional view illustrating a cross-sectional structure of a high withstand voltage semiconductor device 54B which is the modification of the fourth preferred embodiment. An XYZ orthogonal coordinate system is illustrated in FIG. 16. FIG. 16 corresponds to a cross-sectional structure taken along line G-G in FIG. 13.

Hereinafter, features similar to those of the high withstand voltage semiconductor device 54 illustrated in FIGS. 13 to 15 will be denoted by the same reference numerals, description thereof will be omitted as appropriate, and feature portions of the high withstand voltage semiconductor device 54B will be mainly described.

As illustrated in FIG. 16, the plurality of divided resistive field plates 6A, which are the plurality of first divided resistive field plates, are formed on the interlayer insulating film 28, and a part thereof is formed so as to overlap the divided resistive field plates 6B in plan view.

Since the interlayer insulating film 28 is interposed between the divided resistive field plate 6A and the divided resistive field plate 6B, the divided resistive field plate 6A and the divided resistive field plate 6B do not have an electrical connection relationship even if the divided resistive field plates 6A and 6B overlap each other in plan view.

Note that, in FIG. 16, the break line provided at the center of the high withstand voltage separation region WS is provided in consideration of the variations of structures in which the number of lap plate regions by the main wiring region including the plurality of divided resistive field plates 6A and 6B exceeds "7". Hereinafter, description will be given on the assumption that the number of lap plate regions is the maximum "7".

In FIG. 16, an insulating region existing under the plurality of divided resistive field plates 6B indicates the insulating region formed when the insulating film 22 and the insulating film 23 are formed.

(Manufacturing Method for Divided Resistive Field Plate 6A)

In the divided resistive field plate 6A, for example, after the interlayer insulating film 28 is formed on the divided resistive field plate 6B, non-doped high-resistance polysilicon is deposited on the interlayer insulating film 28 to obtain a polysilicon layer. The polysilicon layer is adjusted to a desired resistance value by ion implantation. Thereafter, a planar-view pattern of a resist is formed by photolithography, and then isotropic dry etching processing is executed on the polysilicon layer using the patterned resist as a mask to obtain the divided resistive field plate 6A.

(Effects)

The high withstand voltage semiconductor device 54B which is the modification of the fourth preferred embodiment has the following effects in addition to the effects of the high withstand voltage semiconductor device 54.

In the high withstand voltage semiconductor device 54B, the divided resistive field plate 6A serving as the first divided resistive field plate and the divided resistive field plate 6B serving as the second divided resistive field plate are provided so as to partially overlap each other in plan view.

Therefore, the formation density in the lapping direction of the plurality of divided resistive field plates 6A and 6B can be increased, and accordingly, the number of lap plate regions in the main wiring region having the same area can be increased.

For example, in the example illustrated in FIG. 16, the four divided resistive field plates 6A and the three divided resistive field plates 6B alternately lap in the order of the divided resistive field plates 6A, 6B, 6A, 6B, 6A, 6B, and 6A from the innermost side to the outermost side, and the number of lap plate regions is "7", which is larger than that of the high withstand voltage semiconductor device 54.

As a result, the high withstand voltage semiconductor device 54B which is the modification of the fourth preferred embodiment can further increase the wiring length of the main wiring region and the resistance value as compared with the high withstand voltage semiconductor device 54 as the basic configuration.

(Variations in Divided Resistive Field Plates 6A and 6B)

In the structure illustrated in FIG. 14, the divided resistive field plate 6A and the divided resistive field plate 6B are alternately formed every lap around the outer periphery of the high potential region 1, but the number and periodicity of the divided resistive field plates 6B are not limited.

For example, the divided resistive field plate 6B may be formed one lap or two laps every two laps of the divided resistive field plate 6A on the outer periphery on the side of the high potential region 1. In addition, the divided resistive field plate 6B may be formed one lap, two laps, or three laps every three laps of the divided resistive field plate 6A.

However, in order to increase the resistance value of the main wiring region more, it is necessary to more densely arrange the divided resistive field plates 6A and 6B in a limited region, and thus it is desirable to alternately form the divided resistive field plate 6A and the divided resistive field plate 6B every lap on the outer periphery of the high potential region 1. In this case, a desired resistance value can be obtained by reducing the main wiring region.

In addition, in the planar structure illustrated in FIG. 13, the divided resistive field plate 6A is arranged outside the divided resistive field plate 6B in the cross section taken along line G-G. The planar arrangement may be changed to reverse the planar arrangement between the divided resistive field plates 6A and 6B, and the divided resistive field plate 6B may be arranged outside the divided resistive field plate 6A in the cross section taken along line G-G.

Furthermore, in the third preferred embodiment, the plurality of divided resistive field plates 6A and 6B are illustrated as two thin film resistors having different formation layers, but three or more divided resistive field plates may be provided as three or more thin film resistors having different formation layers.

However, when three or more divided resistive field plates are provided, it is necessary to provide a thin film resistor with a multilayer structure of three or more layers. When the thin film resistor has a multilayer structure of three or more layers, the process cost is increased. Therefore, the present invention is desirably applied to a case where a thin film resistor having a multilayer structure of three or more layers is required from the viewpoint of the element configuration.

(Other Modifications)

In addition, in a case where the high withstand voltage semiconductor device 54 of the fourth preferred embodiment includes the MOSFETs 41 and 42 as in the high withstand voltage semiconductor device 51B illustrated in FIGS. 4 and 5, a second modification having the following features is conceivable.

In the second modification, the plurality of divided resistive field plates 6B which are the plurality of simultaneously manufactured divided resistive field plates, the gate electrode G1 of each of the plurality of MOSFETs 41, and the gate electrode G2 of each of the plurality of MOSFETs 42 are provided on the same formation layer.

Therefore, in the second modification of the fourth preferred embodiment, the plurality of divided resistive field plates 6B can be formed together when the main electrode 3, the main electrode 4, the gate electrode G1, and the gate electrode G2 are formed.

In the second modification of the fourth preferred embodiment, similarly to the high withstand voltage semiconductor device 51B of the modification of the first preferred embodiment, the plurality of divided resistive field plates 6B which are the plurality of simultaneously manufactured divided resistive field plates can be manufactured together when the main electrode 3, the main electrode 4, the plurality of gate electrodes G1, and the plurality of gate electrodes G2 are manufactured.

As a result, the second modification of the fourth preferred embodiment has a structure including MOSFETs in the high potential region 1 and the low potential region 2, and can suppress an increase in process cost required for the manufacturing process.

Furthermore, in the high withstand voltage semiconductor device 54 of the fourth preferred embodiment, when the MOSFETs 41 and 42 are provided as in the high withstand voltage semiconductor device 53B illustrated in FIG. 12, a third modification having the following features can be realized.

In the third modification, one wiring layer among the wiring layers of the multilayer structure of the jumper wiring 25, the gate wiring LG1 of each of the plurality of MOSFETs 41, and the gate wiring LG2 of each of the plurality of MOSFETs 42 are provided on the same formation layer.

Therefore, in the third modification of the fourth preferred embodiment, since the simultaneous manufacturing wiring layer of each of the plurality of jumper wirings 25 can be manufactured together when the gate wirings LG1 and LG2 of each of the plurality of MOSFETs 41 and 42 are manufactured, an increase in process cost required for the manufacturing process can be suppressed.

(Variations in Jumper Wiring 25)

The number of metal wiring layers of the jumper wiring 25 in the high withstand voltage semiconductor devices 54, 54B, and 54B of the fourth preferred embodiment can be arbitrarily set similarly to the jumper wiring 30 of the third preferred embodiment.

In addition, in FIG. 13, the plurality of jumper wirings 25 are symmetrically arranged on the entire outer periphery of the high potential region 1 in plan view, but the present invention is not limited to this planar structure similarly to the jumper wirings 30 of the third preferred embodiment.

<Others>

Note that, in the present disclosure, each preferred embodiment can be freely combined, and each preferred embodiment can be appropriately modified or omitted within the scope of the disclosure.

For example, the plurality of floating layers 8 of the high withstand voltage semiconductor devices 51 and 51B of the first preferred embodiment and the plurality of divided floating layers 20 of the high withstand voltage semiconductor devices 52 and 52B of the second preferred embodiment may be further added to the high withstand voltage semiconductor devices 53 and 53B of the third preferred embodiment and the high withstand voltage semiconductor devices 54 and 54B of the fourth preferred embodiment.

When the first preferred embodiment or the second preferred embodiment is applied to the high withstand voltage semiconductor devices 53 and 53B of the third preferred embodiment, it is desirable to provide the plurality of floating layers 8 or the plurality of divided floating layers 20 below the plurality of divided resistive field plates 9.

Hereinafter, the reason will be described. Before forming the metal wiring for the jumper wiring 30, in order to enable formation of a fine pattern, it is common to planarize a step formed by an underlying pattern by reflow accompanied with a heat treatment of boro-phospho silicate glass (BPSG), chemical mechanical polishing (CMP), or the like. Therefore, even if the floating step S8 is formed under the jumper wiring 30 including the metal wiring, the floating step S8 is relaxed, and the effect of increasing the wiring length is diminished or substantially eliminated.

In addition, when the first preferred embodiment or the second preferred embodiment is applied to the high withstand voltage semiconductor devices 54 and 54B of the fourth preferred embodiment, the plurality of floating layers 8 or the plurality of divided floating layers 20 can be provided below the plurality of divided resistive field plates 6A.

When the plurality of divided resistive field plates 6B are formed as the plurality of simultaneously manufactured divided resistive field plates, the divided resistive field plate 6A has a higher resistivity than the divided resistive field plate 6B. Therefore, by providing the plurality of floating layers 8 or the plurality of divided floating layers 20 below the divided resistive field plates 6A, the resistance value of the main wiring region due to the floating step can be effectively increased.

While the disclosure has been shown and described in detail, the foregoing description is in all aspects illustrative and not restrictive. It is therefore understood that numerous modifications and variations can be devised.

What is claimed is:

1. A semiconductor device including a high potential region and a low potential region provided on a semiconductor substrate, the low potential region being provided away from the high potential region so as to surround the high potential region, the semiconductor device comprising:

a first main electrode provided to be electrically connected to the high potential region;

a second main electrode provided to be electrically connected to the low potential region; and an inter-electrode connection portion that is provided in a high withstand voltage separation region between the first and second main electrodes and electrically connects the first main electrode and the second main electrode, wherein the inter-electrode connection portion includes a resistive field plate provided in a spiral shape in plan view so as to surround the high potential region, the semiconductor device further comprising a conductive floating layer provided below the resistive field plate via an insulating film in the high withstand voltage separation region, wherein the conductive floating layer, the first main electrode, and the second main electrode are provided on the same formation layer, and the resistive field plate has a floating step reflecting a film thickness of the conductive floating layer.

2. The semiconductor device according to claim 1, further comprising:

a first MOSFET provided in the high potential region; and a second MOSFET provided in the low potential region, wherein the conductive floating layer, a gate electrode of the first MOSFET, and a gate electrode of the second MOSFET are provided on the same formation layer.

3. The semiconductor device according to claim 1, wherein a film thickness of the conductive floating layer is 100 nm or more.

4. The semiconductor device according to claim 1, wherein the resistive field plate includes a plurality of lap plate regions provided so as to lap around the high potential region a plurality of times in plan view, the conductive floating layer includes a plurality of divided conductive floating layers; and the plurality of conductive floating layers are radially arranged around the high potential region in plan view, and each of the plurality of conductive floating layers is provided below the plurality of lap plate regions.

5. The semiconductor device according to claim 1, wherein the resistive field plate includes a plurality of lap plate regions provided so as to lap around the high potential region a plurality of times in plan view, the conductive floating layer includes a plurality of divided conductive floating layers separated from each other, and each of the plurality of divided conductive floating layers is provided below one of the plurality of lap plate regions.

6. A method for manufacturing a semiconductor device, the semiconductor device including the semiconductor device according to claim 1, the method comprising the steps of:

(a) forming a conductive polysilicon layer on the semiconductor substrate; and (b) patterning the conductive polysilicon layer formed in the step (a) to simultaneously form the conductive floating layer, the first main electrode, and the second main electrode.

* * * * *